US006661355B2

(12) United States Patent
Cornelius et al.

(10) Patent No.: US 6,661,355 B2
(45) Date of Patent: Dec. 9, 2003

(54) METHODS AND APPARATUS FOR CONSTANT-WEIGHT ENCODING & DECODING

(75) Inventors: William P. Cornelius, Los Gatos, CA (US); William C. Athas, San Jose, CA (US)

(73) Assignee: Apple Computer, Inc., Cupertino, CA (US)

( * ) Notice: Subject to any disclaimer, the term of this patent is extended or adjusted under 35 U.S.C. 154(b) by 82 days.

(21) Appl. No.: 09/752,508

(22) Filed: Dec. 27, 2000

(65) Prior Publication Data

US 2002/0118126 A1 Aug. 29, 2002

(51) Int. Cl.[7] .................................................. H03M 5/00
(52) U.S. Cl. ........................... 341/58; 714/18; 365/200; 341/95
(58) Field of Search ...................... 341/95, 58; 709/213; 365/200; 375/134; 714/787; 329/305

(56) References Cited

U.S. PATENT DOCUMENTS

| | | | | |
|---|---|---|---|---|
| 4,573,034 A | | 2/1986 | Schouhamer Immink | 341/95 |
| 5,381,425 A | * | 1/1995 | Bitzer et al. | 714/787 |
| 5,504,774 A | * | 4/1996 | Takai et al. | 375/134 |
| 5,608,760 A | * | 3/1997 | Sandri et al. | 329/304 |
| 5,910,969 A | * | 6/1999 | Sayiner et al. | 341/58 |
| 5,938,773 A | * | 8/1999 | Hauck et al. | 714/18 |
| 6,094,381 A | * | 7/2000 | Isa | 365/200 |
| 6,256,722 B1 | * | 7/2001 | Acton et al. | 709/213 |
| 6,265,994 B1 | * | 7/2001 | Kahlman | 341/58 |

FOREIGN PATENT DOCUMENTS

GB 2160392 * 12/1985

OTHER PUBLICATIONS

Mircea R. Stan and Wayne P. Burleson, Bus Invert Coding for Low–Power I/O, IEEE transaction on VLSI systems, Vol3, No. 1 Mar. 1995, pp. 49 and 50.

Kazuyuki Nakamura and Mard A. Horowitz, A 50% Noise Reduction Interface Using Low–Weight Coding, NEC corporation, Shimokuzawa, Sagamihara, Kangawa 229, Japan Center for Integrated Systems, Stanford University, Stanford, CA 94305, pp. 144 and 145. (IEE 1996).

Luca G. Tallini and Bella Bose, Balanced Codes woth Parallel Encoding and Decoding, IEEE Transaction on Computers, vol. 48, No 8, Aug. 1999, pp. 794–814.

Luca G. Tallini and Bella Bose, Design of Balanced and Constant Weight Codes for VLSI Systems, IEEE Transaction on Computers, vol. 47, No. 5, May 1998.

Jeffrey F. Tabor, Noice Reduction Using Low–Weight and Constant Weight Coding Techniques, Massachusetts Institute of Technology, Aug. 10, 1990.

Youngsoo Shin, Soo–Ik Chae, and Kiyoung Choi, Partial Bus–Invert Coding for Power Optimization of System Level Bus, School of Electric Engineering, Seoul National University, Seoul 151–742, Korea, 1998, pp. 127–129.

J. Pieter M. Schalkwuk, An Algorithm for Source Coding, IEEE Transactions on Information Theory, vol. IT–18, No. 3, May 1972, pp. 395–399.

* cited by examiner

*Primary Examiner*—Jean Bruner Jeanglaude
(74) *Attorney, Agent, or Firm*—Blakely, Sokoloff, Taylor & Zafman LLP

(57) ABSTRACT

Methods and apparatus for spreading and concentrating information to constant-weight encode data words on a parallel data line bus while allowing communication of information across sub-word paths. In one embodiment, data transfer rates previously obtained only with differential architectures are achieved by only a small increase in line count above single ended architectures. For example, an 18-bit data word requires 22 encoded data lines for transmission, where previously, 16 and 32 lines would be required to transmit un-coded data with single-ended and differential architectures respectively. Constant-weight parallel encoding maintains constant current in the parallel-encoded data lines and the high and low potential driver circuits for the signal lines.

143 Claims, 21 Drawing Sheets

| NUMBER OF ENCODED LINES (n) | p=0 | p=1 | p=2 | p=3 | p=4 | p=5 | p=6 | p=7 | p=8 | p=9 | p=10 |
|---|---|---|---|---|---|---|---|---|---|---|---|
| n = 1 | 1. | 1. | | | | | | | | | |
| n = 2 | 1. | 2. | 1. | | | | | | | | |
| n = 3 | 1. | 3. | 3. | 1. | | | | | | | |
| n = 4 | 1. | 4. | 6. | 4. | 1. | | | | | | |
| n = 5 | 1. | 5. | 10. | 10. | 5. | 1. | | | | | |
| n = 6 | 1. | 6. | 15. | 20. | 15. | 6. | 1. | | | | |
| n = 7 | 1. | 7. | 21. | 35. | 35. | 21. | 7. | 1. | | | |
| n = 8 | 1. | 8. | 28. | 56. | 70. | 56. | 28. | 8. | 1. | | |
| n = 9 | 1. | 9. | 36. | 84. | 126. | 126. | 84. | 36. | 9. | 1. | |
| n = 10 | 1. | 10. | 45. | 120. | 210. | 252. | 210. | 120. | 45. | 10. | 1. |

NUMBER OF ONES (P) IN AN ENCODED WORD

| ENCODED WORD LENGTH | CODE STATES | INPUT WORD LENGTH | EXTRA LINES |
|---|---|---|---|
| 3 | 2 | 1 | 2 |
| 4 | 6 | 2 | 2 |
| 5 | 10 | 3 | 2 |
| 6 | 20 | 4 | 2 |
| 7 | 35 | 5 | 2 |
| 8 | 70 | 6 | 2 |
| 9 | 126 | 6 | 3 |
| 10 | 252 | 7 | 3 |
| 11 | 462 | 8 | 3 |
| 12 | 924 | 9 | 3 |
| 13 | 1716 | 10 | 3 |
| 14 | 3432 | 11 | 3 |
| 15 | 6435 | 12 | 3 |
| 16 | 12870 | 13 | 3 |
| 17 | 24310 | 14 | 3 |
| 18 | 48620 | 15 | 3 |
| 19 | 92378 | 16 | 3 |
| 20 | 184756 | 17 | 3 |
| 21 | 352716 | 18 | 3 |

DIFFERENTIAL CONNECTIONS (PRIOR ART)

FIG. 13

Encode Truth Tables for Block Diagram Elements of Sub-word b

Block Jb — 250b

| Db2 | Db1 | Db0 | Eb4-0 |
|---|---|---|---|
| 0 | 0 | 0 | 10010 |
| 0 | 0 | 1 | 10001 |
| 0 | 1 | 0 | 01110 |
| 0 | 1 | 1 | 01010 |
| 1 | 0 | 0 | 01001 |
| 1 | 0 | 1 | 00110 |
| 1 | 1 | 0 | 00101 |
| 1 | 1 | 1 | 00011 |

| Db4 | Db3 | Eb6 | Eb5 |
|---|---|---|---|
| x | 0 | 1 | - |
| x | 1 | 0 | - |
| 0 | x | - | 1 |
| 1 | x | - | 0 |

Block Kb — 252b

| Db2 | Db1 | Db0 | Eb4-0 |
|---|---|---|---|
| 0 | 0 | 0 | 11100 |
| 0 | 0 | 1 | 11010 |
| 0 | 1 | 0 | 11001 |
| 0 | 1 | 1 | 10110 |
| 1 | 0 | 0 | 10101 |
| 1 | 0 | 1 | 10011 |
| 1 | 1 | 0 | 01110 |
| 1 | 1 | 1 | 01101 |

| Db4 | Db3 | Eb6 | Eb5 |
|---|---|---|---|
| x | 0 | 1 | - |
| x | 1 | 0 | - |
| 0 | x | - | 1 |
| 1 | x | - | 0 |

Block Gb — 244b

| Db1 | Db0 | Eb4-0 |
|---|---|---|
| 0 | 0 | 10000 |
| 0 | 1 | 01000 |
| 1 | 0 | 00100 |
| 1 | 1 | 00010 |

| Eb6 | Eb5 |
|---|---|
| 1 | - | always 1 for Gb

Block Hb — 246b

| Db1 | Db0 | Eb4-0 |
|---|---|---|
| 0 | 0 | 11101 |
| 0 | 1 | 11011 |
| 1 | 0 | 10111 |
| 1 | 1 | 01111 |

| Eb6 | Eb5 |
|---|---|
| 0 | - | always 0 for Hb

Block Fb — 248b

| Db1 | Db0 | Eb4-0 |
|---|---|---|
| 0 | 0 | 11000 |
| 0 | 1 | 10100 |
| 1 | 0 | 01011 |
| 1 | 1 | 00111 |

| Db2 | Db1 | Eb6 | Eb5 |
|---|---|---|---|
| x | 0 | 1 | - |
| x | 1 | 0 | - |
| 0 | x | - | 1 |
| 1 | x | - | 0 |

Subchannel b Mux Truth Table — 256b

| Db5 | Db4 | Db3 | Db2 | Block |
|---|---|---|---|---|
| 0 | 0 | 0 | 0 | G |
| 0 | 0 | 0 | 1 | F1 |
| 0 | 0 | 1 | - | J |
| 0 | 1 | 0 | x | K |
| 0 | 1 | 1 | x | J |
| 1 | 0 | 0 | x | K |
| 1 | 0 | 1 | x | K |
| 1 | 1 | 0 | 0 | F2 |
| 1 | 1 | 1 | 1 | H |

Subch b Post Inversion Truth Table — 254b

| Da4 | Da5 | Db5 | Dc5 | Dc4 | PI Eb |
|---|---|---|---|---|---|
| 0 | - | - | - | x | Invert |
| - | - | - | - | - | no Inversion |
| x | 1 | 1 | 1 | 1 | Invert |
| | all other combinations | | | | |

Encode Truth Tables for Block Diagram Elements of Sub-word c

Truth Table for Sub-word Decode    296

Decode Mux Truth Table Sub-word a

| Ea4-0 | Decode Path Mux Control | | | | | Block | Da5 | Da4 | Da3 | Da2 | Da1 | Da0 | |
|---|---|---|---|---|---|---|---|---|---|---|---|---|---|
| | Gas | Has | Fas | Jas | Kas | | | | | | | | |
| 10000 | 1 | 0 | 0 | 0 | 0 | G' | 0 | 0 | 0 | Ea5_ | 0 | 0 | ⎫ |
| 01000 | 1 | 0 | 0 | 0 | 0 | G' | 0 | 0 | 0 | Ea5_ | 0 | 1 | ⎬ 278a |
| 00100 | 1 | 0 | 0 | 0 | 0 | G' | 0 | 0 | 0 | Ea5_ | 1 | 0 | |
| 00010 | 1 | 0 | 0 | 0 | 0 | G' | 0 | 0 | 0 | Ea5 | 1 | 1 | ⎭ |
| 11101 | 0 | 1 | 0 | 0 | 0 | H' | Ea6_·Ea5_ | 1 | 1 | Ea5_ | 0 | 0 | ⎫ |
| 11011 | 0 | 1 | 0 | 0 | 0 | H' | Ea6_·Ea5_ | 1 | 1 | Ea5_ | 0 | 1 | ⎬ 280a |
| 10111 | 0 | 1 | 0 | 0 | 0 | H' | Ea6_·Ea5_ | 1 | 1 | Ea5_ | 1 | 0 | |
| 01111 | 0 | 1 | 0 | 0 | 0 | H' | Ea6_·Ea5 | 1 | 1 | Ea5 | 1 | 1 | ⎭ |
| 11000 | 0 | 0 | 1 | 0 | 0 | F' | Ea5 | Ea5 | Ea5 | Ea5_ | 0 | 0 | ⎫ |
| 10100 | 0 | 0 | 1 | 0 | 0 | F' | Ea5 | Ea5 | Ea5 | Ea5_ | 0 | 1 | ⎬ 282a |
| 01011 | 0 | 0 | 1 | 0 | 0 | F' | Ea5 | Ea5 | Ea5 | Ea5_ | 1 | 0 | |
| 00111 | 0 | 0 | 1 | 0 | 0 | F' | Ea5 | Ea5 | Ea5 | Ea5_ | 1 | 1 | ⎭ |
| 10010 | 0 | 0 | 0 | 1 | 0 | J' | Ea5·Ea6 | Ea6_·Ea5 | Ea5_ | 0 | 0 | 0 | ⎫ |
| 10001 | 0 | 0 | 0 | 1 | 0 | J' | Ea5·Ea6 | Ea6_·Ea5 | Ea5_ | 0 | 0 | 1 | |
| 01100 | 0 | 0 | 0 | 1 | 0 | J' | Ea5·Ea6 | Ea6_·Ea5 | Ea5_ | 0 | 1 | 0 | |
| 01010 | 0 | 0 | 0 | 1 | 0 | J' | Ea5·Ea6 | Ea6_·Ea5 | Ea5_ | 0 | 1 | 1 | ⎬ 284a |
| 01001 | 0 | 0 | 0 | 1 | 0 | J' | Ea5·Ea6 | Ea6_·Ea5 | Ea5_ | 1 | 0 | 0 | |
| 00110 | 0 | 0 | 0 | 1 | 0 | J' | Ea5·Ea6 | Ea6_·Ea5 | Ea5_ | 1 | 0 | 1 | |
| 00101 | 0 | 0 | 0 | 1 | 0 | J' | Ea5·Ea6 | Ea6_·Ea5 | Ea5_ | 1 | 1 | 0 | |
| 00011 | 0 | 0 | 0 | 1 | 0 | J' | Ea5·Ea6 | Ea6_·Ea5 | Ea5_ | 1 | 1 | 1 | ⎭ |
| 11100 | 0 | 0 | 0 | 0 | 1 | K' | Ea6 xor Ea5 | Ea6_ + Ea5 | Ea5_ | 0 | 0 | 0 | ⎫ |
| 11010 | 0 | 0 | 0 | 0 | 1 | K' | Ea6 xor Ea5 | Ea6_ + Ea5 | Ea5_ | 0 | 0 | 1 | |
| 11001 | 0 | 0 | 0 | 0 | 1 | K' | Ea6 xor Ea5 | Ea6_ + Ea5 | Ea5_ | 0 | 1 | 0 | |
| 10110 | 0 | 0 | 0 | 0 | 1 | K' | Ea6 xor Ea5 | Ea6_ + Ea5 | Ea5_ | 0 | 1 | 1 | ⎬ 286a |
| 10101 | 0 | 0 | 0 | 0 | 1 | K' | Ea6 xor Ea5 | Ea6_ + Ea5 | Ea5_ | 1 | 0 | 0 | |
| 10011 | 0 | 0 | 0 | 0 | 1 | K' | Ea6 xor Ea5 | Ea6_ + Ea5 | Ea5_ | 1 | 0 | 1 | |
| 01110 | 0 | 0 | 0 | 0 | 1 | K' | Ea6 xor Ea5 | Ea6_ + Ea5 | Ea5_ | 1 | 1 | 0 | |
| 01101 | 0 | 0 | 0 | 0 | 1 | K' | Ea6 xor Ea5 | Ea6_ + Ea5 | Ea5_ | 1 | 1 | 1 | ⎭ |

Post Inversion Logic

Invert Results of sub-word a decode if W5subCh_c =1

Invert decoded value for sub-word a if
the weight of sub-word c equals 5

| Decode Mux Truth Table Sub-word b | | | | | | | | | | | | |
|---|---|---|---|---|---|---|---|---|---|---|---|---|
| | Decode Path Mux Control | | | | | Block | Db5 | Db4 | Db3 | Db2 | Db1 | Db0 |
| Eb4-0 | Gbs | Hbs | Fbs | Jbs | Kbs | | | | | | | |
| 10000 | 1 | 0 | 0 | 0 | 0 | G' | 0 | 0 | 0 | 0 | 0 | 0 |
| 01000 | 1 | 0 | 0 | 0 | 0 | G' | 0 | 0 | 0 | 0 | 0 | 1 |
| 00100 | 1 | 0 | 0 | 0 | 0 | G' | 0 | 0 | 0 | 0 | 1 | 0 |
| 00010 | 1 | 0 | 0 | 0 | 0 | G' | 0 | 0 | 0 | 0 | 1 | 1 |
| 11101 | 0 | 1 | 0 | 0 | 0 | H' | 1 | 1 | 1 | 1 | 0 | 0 |
| 11011 | 0 | 1 | 0 | 0 | 0 | H' | 1 | 1 | 1 | 1 | 0 | 1 |
| 10111 | 0 | 1 | 0 | 0 | 0 | H' | 1 | 1 | 1 | 1 | 1 | 0 |
| 01111 | 0 | 1 | 0 | 0 | 0 | H' | 1 | 1 | 1 | 1 | 1 | 1 |
| 11000 | 0 | 0 | 1 | 0 | 0 | F' | Eb5 | Eb5 | Eb5 | Eb5_ | 0 | 0 |
| 10100 | 0 | 0 | 1 | 0 | 0 | F' | Eb5 | Eb5 | Eb5 | Eb5_ | 0 | 1 |
| 01011 | 0 | 0 | 1 | 0 | 0 | F' | Eb5 | Eb5 | Eb5 | Eb5_ | 1 | 0 |
| 00111 | 0 | 0 | 1 | 0 | 0 | F' | Eb5 | Eb5 | Eb5 | Eb5_ | 1 | 1 |
| 10010 | 0 | 0 | 0 | 1 | 0 | J' | Eb5·Eb6 | Eb6_ | Eb5_ | 0 | 0 | 0 |
| 10001 | 0 | 0 | 0 | 1 | 0 | J' | Eb5·Eb6 | Eb6_ | Eb5_ | 0 | 0 | 1 |
| 01100 | 0 | 0 | 0 | 1 | 0 | J' | Eb5·Eb6 | Eb6_ | Eb5_ | 0 | 1 | 0 |
| 01010 | 0 | 0 | 0 | 1 | 0 | J' | Eb5·Eb6 | Eb6_ | Eb5_ | 0 | 1 | 1 |
| 01001 | 0 | 0 | 0 | 1 | 0 | J' | Eb5·Eb6 | Eb6_ | Eb5_ | 1 | 0 | 0 |
| 00110 | 0 | 0 | 0 | 1 | 0 | J' | Eb5·Eb6 | Eb6_ | Eb5_ | 1 | 0 | 1 |
| 00101 | 0 | 0 | 0 | 1 | 0 | J' | Eb5·Eb6 | Eb6_ | Eb5_ | 1 | 1 | 0 |
| 00011 | 0 | 0 | 0 | 1 | 0 | J' | Eb5·Eb6 | Eb6_ | Eb5_ | 1 | 1 | 1 |
| 11100 | 0 | 0 | 0 | 0 | 1 | K' | Eb6 + Eb5 | Eb6_ | Eb5_ | 0 | 0 | 0 |
| 11010 | 0 | 0 | 0 | 0 | 1 | K' | Eb6 + Eb5 | Eb6_ | Eb5_ | 0 | 0 | 1 |
| 11001 | 0 | 0 | 0 | 0 | 1 | K' | Eb6 + Eb5 | Eb6_ | Eb5_ | 0 | 1 | 0 |
| 10110 | 0 | 0 | 0 | 0 | 1 | K' | Eb6 + Eb5 | Eb6_ | Eb5_ | 0 | 1 | 1 |
| 10101 | 0 | 0 | 0 | 0 | 1 | K' | Eb6 + Eb5 | Eb6_ | Eb5_ | 1 | 0 | 0 |
| 10011 | 0 | 0 | 0 | 0 | 1 | K' | Eb6 + Eb5 | Eb6_ | Eb5_ | 1 | 0 | 1 |
| 01110 | 0 | 0 | 0 | 0 | 1 | K' | Eb6 + Eb5 | Eb6_ | Eb5_ | 1 | 1 | 0 |
| 01101 | 0 | 0 | 0 | 0 | 1 | K' | Eb6 + Eb5 | Eb6_ | Eb5_ | 1 | 1 | 1 |

Post Inversion Logic

Invert Results of sub-word _b decode if W5subCh_c + W2subCh_a =1
W5subCh_c = Kcs·Ec6·Ec5 + Hcs·(Ec6 + Ec5)
W2subCh_a = Jas·Ea6_·Ea5_ + Gas·(Ea6_ + Ea5_)

Invert decoded value for sub-word b if the weight of sub-word c = 5 and/or the weight of sub-word a = 2

FIG. 20

| Decode Mux Truth Table Sub-word c | | | | | | | | | | | | |
|---|---|---|---|---|---|---|---|---|---|---|---|---|
| | Decode Path Mux Control | | | | | | | | | | | |
| Ec4-0 | Gcs | Hcs | Fcs | Jcs | Kcs | Block | Dc5 | Dc4 | Dc3 | Dc2 | Dc1 | Dc0 |
| 10000 | 1 | 0 | 0 | 0 | 0 | G' | Ec6_+Ec5_ | 0 | 0 | Ec5_ | 0 | 0 |
| 01000 | 1 | 0 | 0 | 0 | 0 | G' | Ec6_+Ec5_ | 0 | 0 | Ec5_ | 0 | 1 |
| 00100 | 1 | 0 | 0 | 0 | 0 | G' | Ec6_+Ec5_ | 0 | 0 | Ec5_ | 1 | 0 |
| 00010 | 1 | 0 | 0 | 0 | 0 | G' | Ec6_+Ec5_ | 0 | 0 | Ec5_ | 1 | 1 |
| 11101 | 0 | 1 | 0 | 0 | 0 | H' | 1 | 1 | 1 | Ec5_ | 0 | 0 |
| 11011 | 0 | 1 | 0 | 0 | 0 | H' | 1 | 1 | 1 | Ec5_ | 0 | 1 |
| 10111 | 0 | 1 | 0 | 0 | 0 | H' | 1 | 1 | 1 | Ec5_ | 1 | 0 |
| 01111 | 0 | 1 | 0 | 0 | 0 | H' | 1 | 1 | 1 | Ec5_ | 1 | 1 |
| 11000 | 0 | 0 | 1 | 0 | 0 | F' | Ec5 | Ec5 | Ec5 | Ec5_ | 0 | 0 |
| 10100 | 0 | 0 | 1 | 0 | 0 | F' | Ec5 | Ec5 | Ec5 | Ec5_ | 0 | 1 |
| 01011 | 0 | 0 | 1 | 0 | 0 | F' | Ec5 | Ec5 | Ec5 | Ec5_ | 1 | 0 |
| 00111 | 0 | 0 | 1 | 0 | 0 | F' | Ec5 | Ec5 | Ec5 | Ec5_ | 1 | 1 |
| 10010 | 0 | 0 | 0 | 1 | 0 | J' | (Ec5 xor Ec6)_ | Ec6_ · Ec5 | Ec5_ | 0 | 0 | 0 |
| 10001 | 0 | 0 | 0 | 1 | 0 | J' | (Ec5 xor Ec6)_ | Ec6_ · Ec5 | Ec5_ | 0 | 0 | 1 |
| 01100 | 0 | 0 | 0 | 1 | 0 | J' | (Ec5 xor Ec6)_ | Ec6_ · Ec5 | Ec5_ | 0 | 1 | 0 |
| 01010 | 0 | 0 | 0 | 1 | 0 | J' | (Ec5 xor Ec6)_ | Ec6_ · Ec5 | Ec5_ | 0 | 1 | 1 |
| 01001 | 0 | 0 | 0 | 1 | 0 | J' | (Ec5 xor Ec6)_ | Ec6_ · Ec5 | Ec5_ | 1 | 0 | 0 |
| 00110 | 0 | 0 | 0 | 1 | 0 | J' | (Ec5 xor Ec6)_ | Ec6_ · Ec5 | Ec5_ | 1 | 0 | 1 |
| 00101 | 0 | 0 | 0 | 1 | 0 | J' | (Ec5 xor Ec6)_ | Ec6_ · Ec5 | Ec5_ | 1 | 1 | 0 |
| 00011 | 0 | 0 | 0 | 1 | 0 | J' | (Ec5 xor Ec6)_ | Ec6_ · Ec5 | Ec5_ | 1 | 1 | 1 |
| 11100 | 0 | 0 | 0 | 0 | 1 | K' | Ec6 + Ec5 | Ec6_ + Ec5 | Ec5_ | 0 | 0 | 0 |
| 11010 | 0 | 0 | 0 | 0 | 1 | K' | Ec6 + Ec5 | Ec6_ + Ec5 | Ec5_ | 0 | 0 | 1 |
| 11001 | 0 | 0 | 0 | 0 | 1 | K' | Ec6 + Ec5 | Ec6_ + Ec5 | Ec5_ | 0 | 1 | 0 |
| 10110 | 0 | 0 | 0 | 0 | 1 | K' | Ec6 + Ec5 | Ec6_ + Ec5 | Ec5_ | 0 | 1 | 1 |
| 10101 | 0 | 0 | 0 | 0 | 1 | K' | Ec6 + Ec5 | Ec6_ + Ec5 | Ec5_ | 1 | 0 | 0 |
| 10011 | 0 | 0 | 0 | 0 | 1 | K' | Ec6 + Ec5 | Ec6_ + Ec5 | Ec5_ | 1 | 0 | 1 |
| 01110 | 0 | 0 | 0 | 0 | 1 | K' | Ec6 + Ec5 | Ec6_ + Ec5 | Ec5_ | 1 | 1 | 0 |
| 01101 | 0 | 0 | 0 | 0 | 1 | K' | Ec6 + Ec5 | Ec6_ + Ec5 | Ec5_ | 1 | 1 | 1 |

Post Inversion Logic

Invert Results of sub-word b decode if W2subCh_a =1

W2subCh_a = Jas·Ea6_·Ea5_ + Gas·(Ea6_ + Ea5_)

Invert decoded value for sub-word c if the weight of sub-word a = 2

(4B/6L EXAMPLE)
CORRESPONDENCE BETWEEN
DECIMAL, BINARY, AND ENCODED VALUES

| 304 | 306 | 308 |
|---|---|---|
| DECIMAL VALUE | BINARY VALUE | ENCODED VALUE |
| DECIMAL COUNT | BINARY COUNT | BINOMIAL COUNT |
| 0 | 0000 | 000111 |
| 1 | 0001 | 001011 |
| 2 | 0010 | 001101 |
| 3 | 0011 | 001110 |
| 4 | 0100 | 010011 |
| 5 | 0101 | 010101 |
| 6 | 0110 | 010110 |
| 7 | 0111 | 011001 |
| 8 | 1000 | 011010 |
| 9 | 1001 | 011100 |
| 10 | 1010 | 100011 |
| 11 | 1011 | 100101 |
| 12 | 1100 | 100110 |
| 13 | 1101 | 101001 |
| 14 | 1110 | 101010 |
| 15 | 1111 | 101100 |
| 16 | EXTRA | 110001 |
| 17 | EXTRA | 110010 |
| 18 | EXTRA | 110100 |
| 19 | EXTRA | 111000 |

METHODS AND APPARATUS FOR CONSTANT-WEIGHT ENCODING & DECODING

FIELD OF THE INVENTION

The present invention relates to the field of information transmission systems. More particularly, in one implementation, the present invention relates to constant-weight encoding and decoding of data words on a parallel data line bus.

BACKGROUND OF THE INVENTION

It is often desirable, in information transmission systems, to transform information into alternate forms. In one instance, a desirable form might be to encode data, to achieve a constant weight code, where each data word contained a constant number of data elements in each logic state. The data words could be binary words occupying two logic states, those of zero and one. This transformation enables the higher supply potential, Vdd, and the lower supply potential, Vss, to maintain constant current to the circuits that drive the signal lines and or constant current in the termination circuit, Vterm. In another instance it may be desirable to spread information from a data word into sub-words and the weight of the sub-words, where the weight of the sub-word is defined to be the number of data elements in each logic state. In a binary system the weight is the number of ones or zeros in a data word. In another instance it may be desirable to minimize the weight so that the power required to drive the parallel data line bus is minimized.

Transmission of N-ary data, where there are more than the traditional two logic states of zero and one, does not impose the same constant weight criterion that is imposed on binary data in order to achieve the constant current conditions mentioned above. There are many combinations of N-ary weight vectors that provide the desired constant current state.

Transmission of binary information on a parallel line bus requires the transmission of data words whose weight ranges from zero to the number of bits in the information word. Therefore, an eight-bit data word has a weight that ranges between zero and eight. Transmission of variable weight data presents problems to interconnect circuits, such as those used in a high-speed bus interface.

In a single-ended parallel interface with line drivers, transmission of variable weight data creates a data-dependent current flow in the Vdd and Vss connections. This data-dependent current flow leads to timing losses. Vdd and Vss interconnect path inductances (L) exist between the voltage sources and the line driver higher and lower potential bias nodes, respectively. A changing current in this inductance path (di/dt) creates voltage variation according to v=Ldi/dt. These voltage changes compromise the integrity of the output signals as a function of data word value. Specifically, they delay high to low and low to high transitions of the signal lines (edges) and create uncertainty in edge location. Both of these effects compromise achievable system speeds. The larger Ldi/dt the greater the degree of the timing loss. If all lines change at once, or if more lines are present di/dt is increases.

Path inductances (L) due to controllable design parameters is already at practical minimal limits. Differential architecture eliminates timing losses due to Vdd and Vss fluctuations, however, this comes at the expense of two lines per bit of information transmitted. It is desirable to obtain differential performance from single-ended architecture. Accordingly, constant-weight parallel encoding has been employed.

Constant-weight parallel encoding can achieve constant Vdd and Vss current flow at the expense of a slight increase in the bus line count. It is possible to achieve many of the benefits of a differential system with only a small increase in lines over single-ended architecture. We will define constant weight parallel encoding to be the result of encoding a data word into an encoded data word with a constant number of data elements in each logic state independent of the input data word value. We further define balanced encoding to be constant-weight parallel encoding such that the number of data elements in each logic state is the same. Thus, a balanced 22-bit encoded data word would have 11 data element whose value was zero and 11 data elements whose value was one. An almost balanced parallel-encoded data word would be closer to the balanced case than the unbalanced case.

As the data word length increases, the complexity of the encode process greatly increases the corresponding time to encode. To employ constant weight parallel encoding in a data transmission system, without compromising performance, requires efficient low latency coding methods. Design of efficient, low latency encoding/decoding methods has been an area of research for the past four decades. Attempts at solving this problem exist in the prior art.

Tallini, G., et. al., "Design of Balanced and Constant Weight Codes for VLSI Systems," IEEE, vol. 47 no. 5, Transactions on Computers May (1998) describes encoding techniques applied to the input word as a whole without partitioning the input word into sub-words. Computation time to encode over an entire word is much greater than the computation time to encode a sub-word, such undivided approaches result in high complexity encode functions. These techniques remain complex and are not easily reduced to low latency implementations on an integrated circuit chip. Burleson, W., et. al., "Bus-Invert Coding for Low-Power I/O," IEEE, vol. 3, no. 1, Transactions on Very Large Scale Integrations (VLSI) Systems March (1995) describes an inversion method for encoding that divides the input word up into sub-words and then proceeds to encode the sub-words to minimize the variability in the weight. Tabor, J., "Noise Reduction Using Low Weight And Constant Weight Coding Techniques," MS Thesis, Artificial Intelligence Lab, MIT, May (1990) also describes dividing the input word into sub-words, but does not achieve constant weight encoding.

The prior-art techniques provide limited simplification of the problem. The prior-art techniques do not provide for sharing of information between sub-words or sub-word paths. Thus, it is desirable to provide efficient, low latency, encoding/decoding methodology that can be implemented with a minimum number of extra lines and encode/decode logic by sharing information between sub-words or sub-word paths to facilitate spreading information into the encoded sub-words as well as into the weight of the encoded sub-words.

SUMMARY OF THE INVENTION

The present invention includes methods for spreading and concentrating information into encoded data sub-words and the weight of the encoded data sub-words. An embodiment of the present invention is directed to efficient apparatus and methods for constant-weight encoding of data that can be implemented with low latency in a data transmission system. Various embodiments of the present invention are described below.

A method including dividing a data word into data subwords onto sub-word paths; allowing communication between the sub-word paths; and encoding the data subwords into encoded data sub-words; such that the information content of the data word is spread between the encoded data sub-words and the weight of the encoded data sub-words.

Another method includes: allowing communication between sub-word paths; and decoding encoded data subwords into data sub-words; such that the data sub-words form a data word whereby the information content of the data word is concentrated back into the data word.

A preferred embodiment, of the present invention, includes a method of encoding a data word, whose data elements occupy at least a first logic state and a second logic state, the method includes: receiving data sub-words onto sub-word paths, the data sub-words comprising sets of data elements of the data word; and encoding the data sub-words into encoded data sub-words; such that the encoded data sub-words form an encoded data word wherein the information content of the data word is spread between the encoded data sub-words and the weight of the encoded data sub-words.

Another embodiment, of the present invention, includes an encoder module, to encode a data word, whose data elements occupy at least a first logic state and a second logic state, the encoder module includes: at least two sub-word paths, each of the at least two sub-word paths to receive a data sub-word, including a set of data elements of the data word; and an encoder coupled with the at least two sub-word paths, the encoder to encode the data sub-word into an encoded data sub-word; such that encoded data sub-words form an encoded data word wherein the information content of the data word is spread between the encoded data subwords and the weight of the encoded data sub-words.

In another embodiment, the present invention provides a decoder module to decode an encoded data word, whose encoded data elements occupy at least a first logic state and a second logic state, the decoder module includes: at least two sub-word paths, each of said at least two sub-word paths to receive an encoded data sub-word, including a set of data elements of the encoded data word and to allow communication, between said at least two sub-word paths, such that information may be shared between the at least two sub-word paths; and a decoder coupled with the at least two sub-word paths, the decoder to decode the encoded data sub-word into a data sub-word; such that data sub-words form a data word.

Yet another embodiment, of the present invention, includes a method of decoding an encoded data word, whose encoded data elements occupy at least a first logic state and a second logic state, the method includes: receiving encoded data sub-words onto sub-word paths, the encoded data sub-words including sets of data elements of the encoded data word; allowing communication between the sub-word paths, such that information may be shared between the sub-word paths; and decoding the encoded data sub-words into data sub-words; such that the data sub-words form a data word.

Another preferred embodiment, of the present invention, is a data processing system including: at least two sub-word paths, each of said at least two sub-word paths to receive a data sub-word, comprising a set of data elements of a data word; an encoder coupled with the at least two sub-word paths, the encoder to encode the data sub-word into an encoded data sub-word; such that encoded data sub-words form an encoded data word wherein the information content of the data word is spread between the encoded data sub-words and the weight of the encoded data sub-words; a parallel encoded data line bus coupled with the at least two sub-word paths to receive the encoded data sub-words and to facilitate transmission of the encoded data sub-words; at least two sub-word paths coupled with the parallel encoded data line bus, each of the at least two sub-word paths to receive an encoded data sub-word, including a set of data elements of the encoded data word and allowing communication, between the at least two sub-word paths, such that information may be shared between the at least two sub-word paths; and a decoder coupled with the at least two sub-word paths, the decoder to decode the encoded data sub-word into the data sub-word; such that data sub-words form the data word.

Another preferred embodiment, of the present invention, is a method for transmitting a data word in a data processing system, the method comprising: receiving data sub-words onto sub-word paths, the data sub-words comprising sets of data elements of the data word; encoding the data sub-words into encoded data sub-words, such that the encoded data sub-words form an encoded data word wherein the information content of the data word is spread between the encoded data sub-words and the weight of the encoded data sub-words; transmitting the encoded data sub-words over a parallel encoded data line bus; receiving the encoded data sub-words onto the sub-word paths, the encoded data subwords comprising sets of data elements of the encoded data word; allowing communication, between the sub-word paths, such that information may be shared between the sub-word paths; and decoding the encoded data sub-words into the data sub-words; such that the data sub-words form the data word.

BRIEF DESCRIPTION OF THE DRAWINGS

The present invention is illustrated by way of example and not limited in the Figures of the accompanying drawings, in which like references indicate similar elements.

FIG. 3 depicts a property of binary numbers, a binomial expansion, which shows the relationship between the number of elements in a binary word, n, the weight of the binary word, p, and the number of unique states available for the chosen weight p and binary word size n.

FIG. 4 is a table, which summarizes relevant properties of binary numbers, showing the minimum number of extra lines required to achieve constant-weight coding.

FIG. 13 shows the truth tables employed by the encoder blocks shown in FIG. 12.

FIG. 15 shows the truth tables employed by the encoder blocks shown in FIG. 14.

FIG. 17 shows the truth tables employed by the encoder blocks shown in FIG. 16.

FIG. 19 shows the truth tables employed by the decoder blocks shown in FIG. 18 for sub-word a.

FIG. 20 shows the truth tables employed by the decoder blocks shown in FIG. 18 for sub-word b.

FIG. 21 shows the truth tables employed by the decoder blocks shown in FIG. 18 for sub-word c.

DETAILED DESCRIPTION

Figure 1:
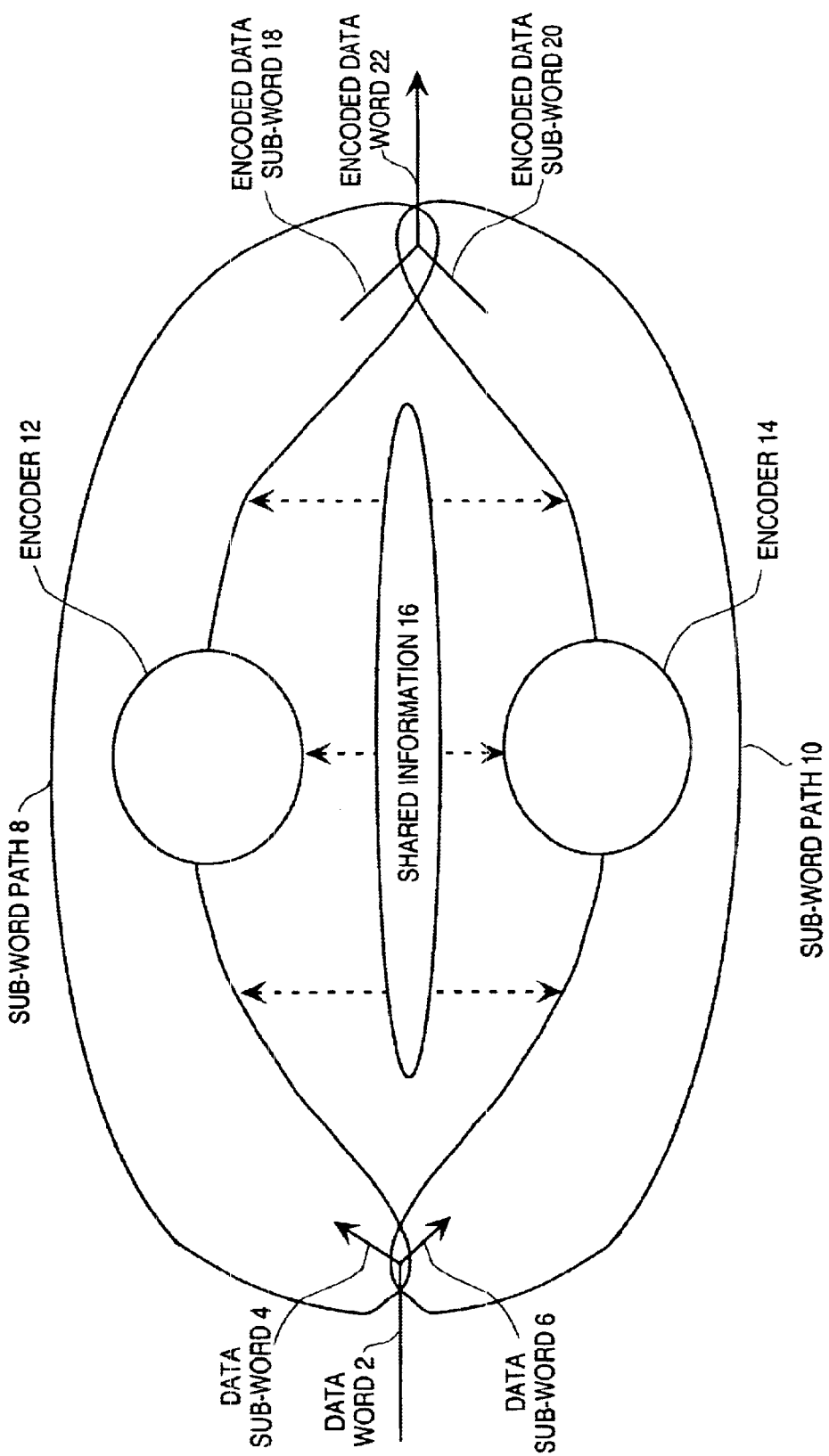
FIG. 1 depicts multiple sub-word paths and information sharing between sub-word paths, along with input data word to encoded data word flow.

FIG. 1 depicts multiple sub-word paths and information sharing between sub-word paths, along with input data word to encoded data word flow. With reference to FIG. 1, data word 2 is split into data sub-word 4 and data sub-word 6. Data sub-word 4 travels along sub-word path 8 and data sub-word 6 travels along sub-word path 10. Encoder 12 is connected with sub-word path 8 and encodes data sub-word 4. Encoder 14 is connected with sub-word path 10 and encodes data sub-word 6. It will be appreciated that many alternatives are possible, for example, encoder 12 could be comprised of a plurality of encoders or encoder 12 and encoder 14 could be a single encoder connected with both sub-word path 8 and sub-word path 10. A plurality of encoders in contact with a sub-word path could encode the sub-word in parallel.

Shared information 16 allows information to be shared between sub-word paths. Shared information 16 can occur anywhere along the sub-word paths. For example, shared information 16 could occur before encoder 12, shared information 16 could occur between encoder 12 and encoder 14. Shared information 16 could occur between the sub-word paths after the encoders. It will be appreciated that shared information 16 could occur between sub-word path 8 and sub-word path 10 in orders not specifically defined, the order does not limit the present invention.

Data sub-word 4 travels along sub-word path 8 and is encoded by encoder 12, encoded data sub-word 18 results from shared information 16 and encoder 12. Data sub-word 6 travels along sub-word path 10 and is encoded by encoder 14, encoded data sub-word 20 results from shared information 16 and encoder 14. Encoded data sub-word 18 and encoded data sub-word 20 are combined to form encoded data word 22. The encoding provided by encoder 12 and encoder 14 on data sub-word 4 and data sub-word 6 may result in encoded data word 22 being either, small-variance-weight, constant-weight, or balanced.

Figure 2:
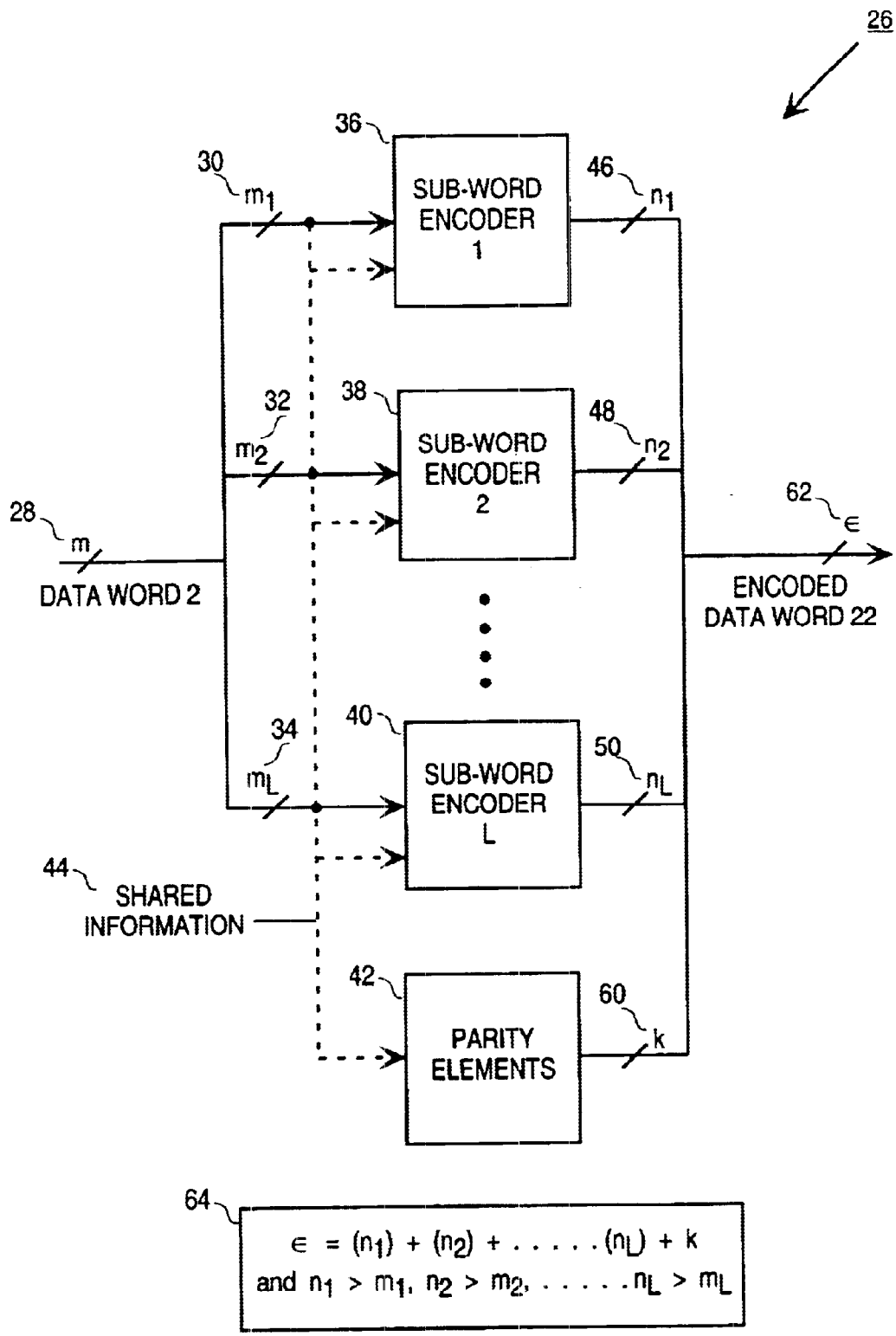
FIG. 2 applies the concept of shared information to the creation of a constant-weight encoded data word.

FIG. 2 applies the concept of shared information to the creation of a constant-weight encoded data word. With reference to FIG. 2, an embodiment of the present invention provides constant-weight weight encoding 26, accomplished with a plurality of encoders and a parity element that leads to a low latency logic integrated circuit implementation. Data word 2 is input on m input information word lines 28. Input information word lines m 28 are divided between sub-word 1 lines $m_1$ 30, sub-word 2 lines $m_2$ 32, up to sub-word L lines $m_L$ 34.

Sub-word 1 lines $m_1$ 30 connect with sub-word encoder 1 36. Similarly, sub-word 2 lines $m_2$ 32 connect with sub-word encoder 2 38 up to sub-word L lines $m_L$ 34 connecting with sub-word encoder L 40. It will be appreciated that input data word 2 may be divided into a general number of sub-words as indicated by index L. It will also be appreciated by those of skill in the art that the sub-words need not contain the same number of data elements from input data word 2, but can be of different size. The architecture shown in constant-weight weight encoding 26 is equivalent to the sub-word paths shown in FIG. 1 with the encoders connected with each sub-word path. Shared information 44 may be exchanged between sub-word 1 lines $m_1$ 30, sub-word 2 lines $m_2$ 32, sub-word 3 lines $m_3$ 34, sub-word encoder 1 36, sub-word encoder 2 38, sub-word encoder L 40, and parity elements 42.

Sub-word encoder 1 36 has lines $n_1$ 46 that are used to output the encoded data sub-word. Sub-word encoder 2 38 has lines $n_2$ 48 that are used to output the encoded data sub-word. Sub-word encoder L 40 has lines $n_L$ 50 that are used to output the encoded data word. The sub-words from sub-word encoder 1 36, sub-word encoder 2 38, up to sub-word encoder L 40 are combined with parity element 42 to form encoded data sub-word 22, which is output on total encoded lines 62. Equation 64 shows the relations between total encoded line count 62, and the line count from each sub-word encoder and parity lines 60.

FIG. 3 depicts a property of binary numbers, a binomial expansion, which shows the relationship between the number of elements in a binary word, n, the weight of the binary word, p, and the number of unique states available for the chosen weight p. With reference to FIG. 3, Binomial coefficient matrix 66 may be used for devising various methods of encoding data words. One such method, leads to a low latency logic implementation in an integrated circuit. According to this method, it is desirable to break up a long data word into shorter sub-words. Shorter sub-words can be encoded in less time than longer data words. With reference to binomial coefficient matrix 66, it will be noted that an encoded word seven elements in length, n=7, has 35 states in which there are three ones, p=3 and 35 states in which there are four ones, p=4. Therefore, a total of 70 states exist in the encoded word with either three or four ones in each encoded data word.

FIG. 4 is a table, which summarizes relevant properties of binary numbers, showing the minimum number of extra lines required to achieve constant weight coding. With reference to FIG. 4, table 68 indicates the minimum number of extra lines necessary for each input word length encoded. The last column titled "extra lines" represents encoding optimized to provide a minimum number of extra lines. The best mode of the present invention will add one extra line over the optimum shown in table 68 for encoding a binary word size of 18, resulting in 22 encoded bits in the encoded data word. However, decreased encode time is achieved with the combination of smaller sub-word size and sharing of information across sub-word paths. Thus, the best mode of the present invention encodes three 6-bit input words with a total of 22 encoded lines, which is two lines less than the 24 required by binomially encoding three 6-bit input words.

Figure 5:
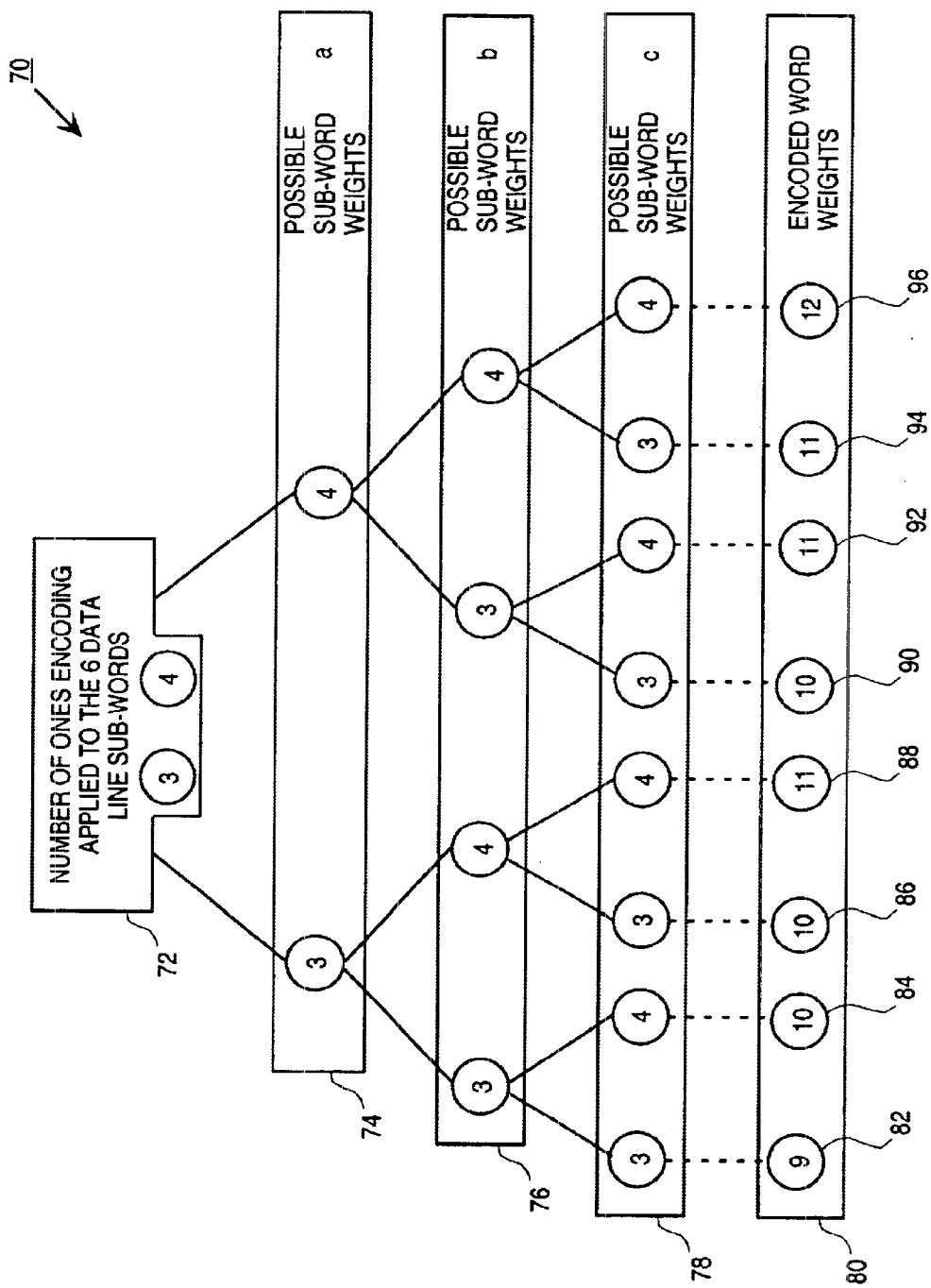
FIG. 5 is a code-weight vector tree that depicts parallel encoding within a sub-word, spreading information into the sub-words, and the resulting encoded word weights that result without sharing information across sub-words.

FIG. 5 is a code-weight vector tree that depicts parallel encoding within a sub-word, spreading information into the sub-words and the resulting encoded word weights that result without sharing information across sub-words. With reference to FIG. 5, code-weight vector tree 70 shows the encoded word weights that are possible when an 18-bit word is divided into three sub-words, each 6-bits in length, according to one embodiment of the present invention. Number of encoding weights applied to a sub-word 72 applies weights three and four to sub-words a, b, and c. Weights for sub-word a 74, weights for sub-word b 76, and weights for sub-word c 78 show the possible branches of the tree that result in encoded word weights 80. Encoded word weights 80 include encoded word weights that range from nine to 12. Encoded word weight 82, which results in a total encoded word weight of nine, results from encoded sub-word weights of three for each sub-word. Encoded word weight 96, which results in a total encoded word weight of 12, results from encoded sub-word weights of four for each sub-word. The branches of the code-weight vector tree (FIG. 5) are listed as rows in Table 1 along with the corresponding reference numeral for the encoded word weight.

Transmission of encoded word weights 80 results in a small-variance-weight encoding scheme. The small-variance-weight encoded words have a much narrower weight range than do the input data words. 18-bit input data word values range between all zeros and all ones, causing the word weight to ranging from zero to 18. The small-variance-weight encoded data word weights vary from nine to 12 for an encoded data word utilizing 21 lines. The reduced weight variance provides an improved solution to the problems described earlier with Vdd and Vss current fluctuations during transmission.

TABLE 1

Code weight vectors from FIG. 5

| Weight of Sub-word a | Weight of Sub-word b | Weight of Sub-word c | Encoded word weights 80 (FIG. 5) | Encoded word weight reference numeral (FIG. 5) |
|---|---|---|---|---|
| 3 | 3 | 3 | 9 | 82 |
| 3 | 3 | 4 | 10 | 84 |
| 3 | 4 | 3 | 10 | 86 |
| 3 | 4 | 4 | 11 | 88 |
| 4 | 3 | 3 | 10 | 90 |
| 4 | 3 | 4 | 11 | 92 |
| 4 | 4 | 3 | 11 | 94 |
| 4 | 4 | 4 | 12 | 96 |

However, further reduction in the variance of the encoded word weight can be achieved by employing shared information across sub-word paths in order to produce constant weight encoded data. By inspecting the range of encoded word weight, nine to 12, it is evident that by encoding two ones, and employing a single parity line, balanced constant-weight encoded data words will be achieved with weight of 11, on 22 total lines by allowing communication between sub-word paths.

Each branch of code weight vector tree 70 encodes a constant number of states for an encoded sub-word of length 7 bits, $$2^6 \cdot 2^6 \cdot 2^6 = 262,144.$$

Each code weight vector encodes the same number of states:

$$2^5 \cdot 2^5 \cdot 2^5 = 2^{15}.$$

There are eight code weight vectors in the tree as indicated by the eight rows in table 1. Therefore the total number of states encoded is:

$$8 \cdot 2^{15} = 2^{18}.$$

No information is carried by the weight of the code at each level because at each level the code can be either three or four. Knowing the weight at any level in the tree does not help you determine how to encode the sub-word at any other level. Thus there are no constraints placed on the weight, except that they must be either three or four. The resulting code-weight vectors range from nine to 12 as shown in encoded word weights 80.

The code variance at each level in the tree of FIG. 5 is three or four. If the variance is increased to two, three, four, or five, the total number of possible states becomes:

$$(2^4 = 2^5 = 2^4)^3 = 844,736.$$

Only 262,144 states of the possible 844,736 states are needed to encode 18-bit input numbers. The fully-expanded tree diagram would contain 84 nodes and the code-weight vectors encoded word weight would range from 6 to 15. However, we only need a subset of the code-weight vectors to cover 262,144 input states. The tree diagram of FIG. 6 contains 20 nodes, which are sufficient to cover 262,144 input states. Each code-weight vector encodes the following number of states:

code-weight vector {2,4,4} contains 16,384 states;
code-weight vector {3,3,5} contains 16,384 states;
code-weight vector {4,4,2} contains 16,384 states;
code-weight vector {5,3,3} contains 16,384 states;
code-weight vector {3,3,4} contains 32,768 states;
code-weight vector {3,4,4} contains 32,768 states;
code-weight vector {4,3,3} contains 32,768 states;
code-weight vector {4,3,4} contains 32,768 states;
code-weight vector {4,4,3} contains 32,768 states.

The sum of these code-weight vectors contain 262,144 states and the weight is either 10 or 11. By adding a single parity bit, the almost-constant code of 10 or 11 can be made into a constant (and balanced) code of 11.

Figure 6:
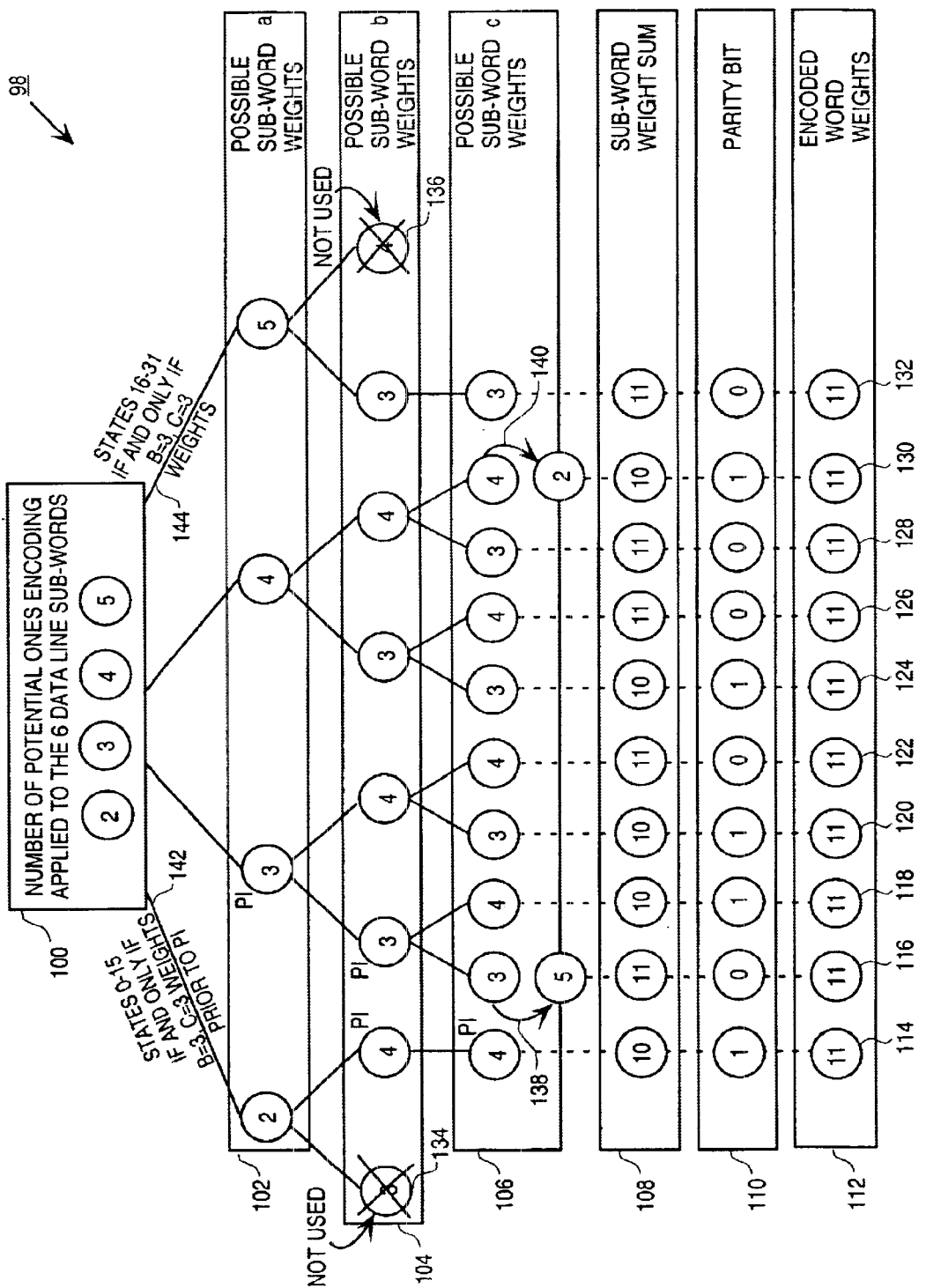
FIG. 6 is a code-weight vector tree that depicts parallel encoding within sub-words, information sharing across subwords, spreading information into the sub-words as well as the weight of the sub-word, and then using the shared information to achieve a constant-weight encoded data word.

FIG. 6 is a code-weight vector tree that depicts parallel encoding within sub-words, spreading information into the sub-words as well as the weight of the sub-word, information sharing across sub-words, and then using the shared information to achieve a balanced constant-weight encoded data word.

With reference to FIG. 6, information carried in the individual sub-word weights is used to encode the other sub-words. For example, if sub-word a is 2, then sub-words b and c must have weight 4 as shown 10 FIG. 6.

It will be appreciated by those with skill in the art that an encoded sub-word of weight three and length seven can be simply converted to a sub-word of weight four by inverting each of the output data elements and vice versa. Likewise, an encoded sub-word of weight two and length seven can be simply converted to a sub-word of weight five by the same inversion technique which also applies vice versa.

According to the best mode of the present invention, the determination of the encoded sub-word weight is made by examining the most significant one or two bits of the individual sub-words. The encoding for sub-channel a based on the input bits $d_0 \ldots d_5$ of FIG. 11 and the most significant bit from sub-word b ($d_{11}$) and the two most significant bits from sub-word c ($d_{17}$ and $d_{16}$). If the most significant bit of sub-words a, b, and c are all zero, then the first sixteen sub-words of the sub-word a are encoded with weight two and the second set of sixteen encoded sub-words of sub-word a are encoded with five. Otherwise, the first thirty-two encoded sub-words of sub-word a are of weight three and the next thirty-two encoded sub-words of sub-word a are of weight four. There is one exception in accordance with the code-weight vector tree diagram of FIG. 6. If the most significant bit of sub-word b and the two most significant bits of sub-word c are all one, then the second set of thirty-two states are of weight three.

Figure 11:
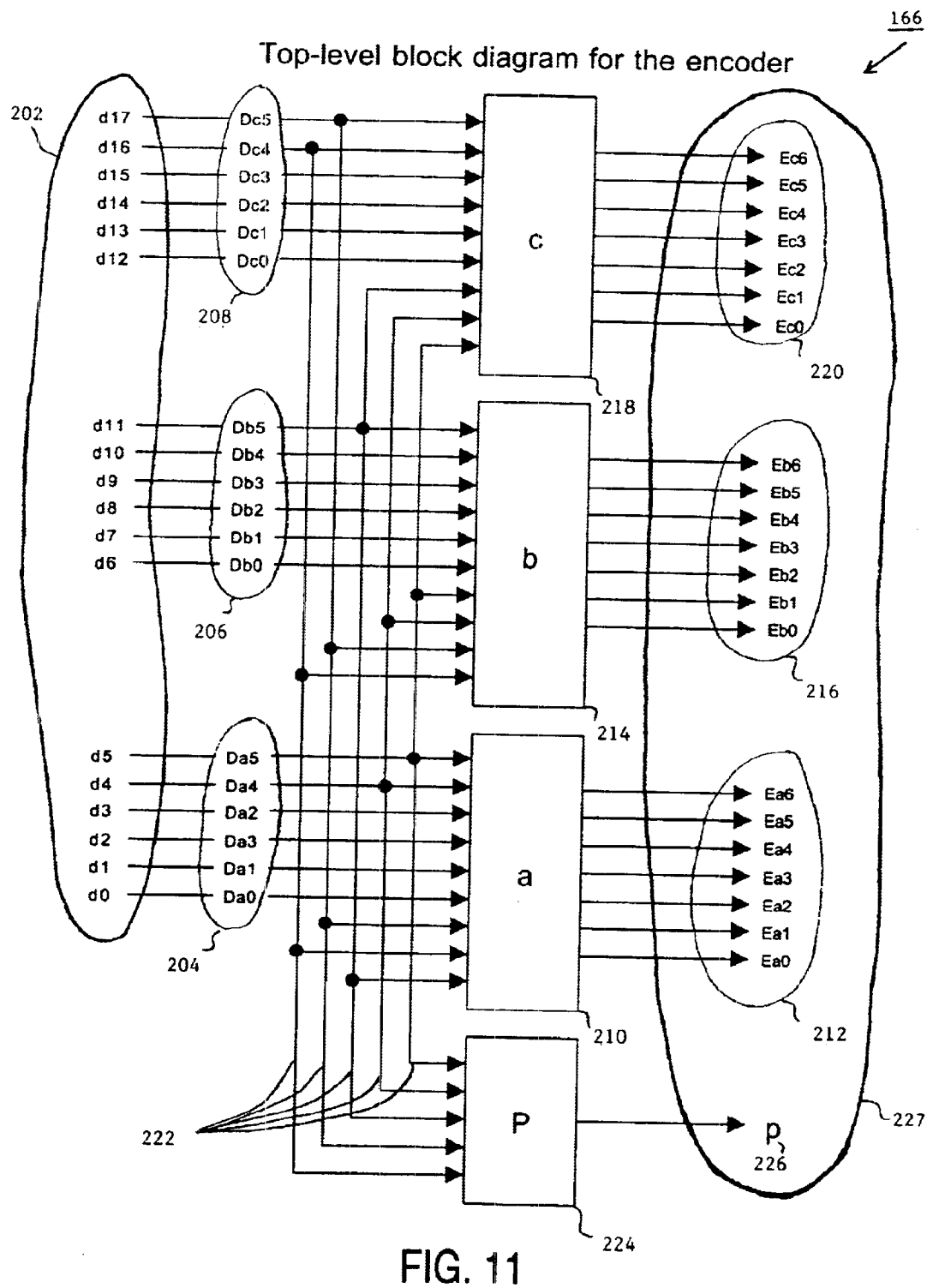
FIG. 11 is an embodiment illustrating the best mode of the present invention as applied to an encoder for the specific case of encoding an 18-bit data word.

The encoding for the sub-words of sub-word b is based in the input bits $d_6 \ldots d_{11}$ of FIG. 11 and the two most significant bits from sub-word a ($d_5$ and $d_4$) and the two most significant bits from sub-word c ($d_{17}$ and $d_{16}$). The first thirty-two encoded sub-words of sub-word b are weight three and the second set of thirty-two encoded sub-words of sub-word c are of weight four. There are two exceptions in accordance with the weight-code vector tree diagram of FIG. 6. The first exception is that if the most significant bit of sub-word a is one and the two most significant bits of sub-word c are one then the second-set of thirty-two sub-words of sub-channel c are of weight three. The second exception is that if the most significant bit of sub-word a is zero and the two most significant bits of sub-word c are zero then the first set of thirty-two sub-words of the sub-channel c are of weight four.

From the previous discussion of FIG. 3 it will be noted that a seven element encoded word has 35 states in which there are three ones and 35 states in which there are four ones, always set high, thus a 6-bit data word can be encoded by using both sets of states. A 6-bit data word requires 64 states, leaving six states unused. The first 32 states of the 6-bit input word will be encoded with three ones and the second 32 states will be encoded with four ones. Exceptions to this encode scheme will occur when the three input sub-words result in weights of three or weights of four being generated simultaneously in each encoded sub-word. Alternative encoding is required to handle the encoded word weights of nine and 12 shown in FIG. 5 and Table 1. With reference to FIG. 6, code-weight vector tree 98 shows the encoded sub-word weights that are possible in the encoding architecture for an 18-bit input data word divided into three 6-bit sub-words.

Weights for sub-word a 102 include encoding sub-word a with two ones or the inverse of two ones encoding which is five ones encoding along with three and four ones encoding. It will be appreciated by those of skill in the art that four ones encoding is the inverse of three ones encoding. Alternative encode paths 142 and 144, for encoding two ones and encoding five ones respectively, in sub-word a, are alternative encodings that are done in conjunction with information sharing in order to reduce the weight variance of the encoded word weights that result in nine or 12. Selective use of alternative encode paths 142 and 144 result in paths 134 and 136 being bared from use in the alternative encoding scheme. Thus, additional encoding states exist for which are not used. Weights for sub-word b 104 are limited to three ones or four ones encoding. Weights for sub-word c 106 include two, three, four, and five ones encoding.

Information sharing across sub-words reduces the weight variance of the encoded data words and ultimately made constant. For the case of each sub-word simultaneously encoding into a weight of three, the 32 states in sub-word a, are split into two cases with 16 states in each. The first case (states 0 to 15) is encoded using two ones. According to the best mode of the present invention, this case was chosen to occur when the second most significant bit (MSB) of sub-word a is equal to zero. Many others ways of making this choice exist. Encoded sub-words b and c are inverted which changes the weight of sub-words b and c from three to four. The resulting code weight vector {2,4,4} is shown in code-weight vector tree 98 resulting in sub-word weight sum 108 of ten resulting in encoded word weight 114 equal to eleven by setting parity bit value 110 to one. The inversion of the pre-balanced encoded sub-words b and c is called post inversion (PI).

The fact that the weight of encoded sub-word a equals two imparts the information that on decode, the inversion of encoded sub-words b and c must be considered. Thus, information is shared across sub-word paths in terms of the weight of the sub-word.

The second case for each sub-word simultaneously encoding into a weight of three (states 16 to 31) requires sub-word a to be encoded with five ones. In the best mode, of the present invention, this case occurs when the second MSB of sub-word a is equal to one. The resulting code-weight vector {5,3,3} is shown in code-weight vector tree 98 resulting in sub-word weight sum 108 of eleven resulting in encoded word weight 132 equal to eleven, by setting parity bit value 110 to zero. No PI of encoded sub-word b or c is required.

It will be appreciated that the case of each sub-word encoding into a weight of three ones occurs when the first MSB of each sub-word equals zero. When the second MSB of encoded sub-word a equals zero encoded sub-words b and c must be decoded accordingly.

The special case of each encoded sub-word resulting in a weight of four is treated with alternative encoding 138 and alternative encoding 140 applied to sub-word c. In the best mode, of the present invention, the second MSB of sub-word c is used to split the encoding for sub-word c into the two cases. When the second MSB of sub-word c equals zero the first 16 states (0 to 15) are encoded using two ones, alternative encoding 140, and when the second MSB of sub-word c equals one, the second 16 states (16 to 31) are encoded using five ones, alternative encoding 138.

The first case using alternative encoding 140 results in code-weight vector {4,4,2} as shown in code weight vector tree 98 resulting in sub-word weight sum 108 equal to ten resulting in encoded word weight 130 equal to 11 by setting parity bit value 110 to one. No PI of encoded sub-word a or b is required.

The second case, when the second MSB of sub-word c equals one and sub-word c is encoded using five ones, alternative encoding 138, results in the need to invert encoded sub-words a and b. The resulting code weight vector {3,3,5} is shown in code-weight vector tree 98 resulting in sub-word weight sum 108 of eleven resulting in encoded word weight 116 equal to eleven by setting parity bit value 110 to zero. On decode, the weight of sub-word c equal to five will provide the information that encoded sub-words a and b need to be decoded accordingly because of the PI previously applied.

The shared information that is occurring in the encoding process just described is the first and second MSB of sub-words a and c, as well as the first MSB of sub-word b.

Alternative encoding is not required for combinations of mixed sub-word weights of three and four. Thus, encoded word weight 118, encoded word weight 120, encoded word weight 122, encoded word weight 124, encoded word weight 126, and encoded word weight 128, result from weight vectors that do not require alternative encoding.

The branches of the code-weight vector tree (FIG. 6) are listed as rows in Table 1 long with the corresponding reference numeral for the encoded word weight. Where post inversion is required, it is so indicated with the symbol PI next to the appropriate sub-word weight. It is evident from Table 2 that the weight variance of encoded data words has been reduced to range between 10 and 11. The single parity line is used to produce the desired constant-weight encoded data words.

TABLE 2

Code weight vectors from FIG. 6

| Weight of Sub-word a | Weight of Sub-word b | Weight of Sub-word c | Encoded word weights 112 (FIG. 6) | Encoded word weight reference numeral (FIG. 6) |
|---|---|---|---|---|
| 2 | 4 PI | 4 PI | 10 | 114 |
| 3 PI | 3 PI | 5 | 11 | 116 |
| 3 | 3 | 4 | 10 | 118 |
| 3 | 4 | 3 | 10 | 120 |
| 3 | 4 | 4 | 11 | 122 |
| 4 | 3 | 3 | 10 | 124 |
| 4 | 3 | 4 | 11 | 126 |
| 4 | 4 | 3 | 11 | 128 |
| 4 | 4 | 2 | 10 | 130 |
| 5 | 3 | 3 | 11 | 132 |

It will be appreciated by those of skill in the art that the embodiment of the present invention just described, is not limited to three sub-words, but is generally applicable, as shown in FIG. 2, to a general number of sub-words, L, indicated by sub-word encoder L 40 and a general number of parity lines 60.

Figure 7:
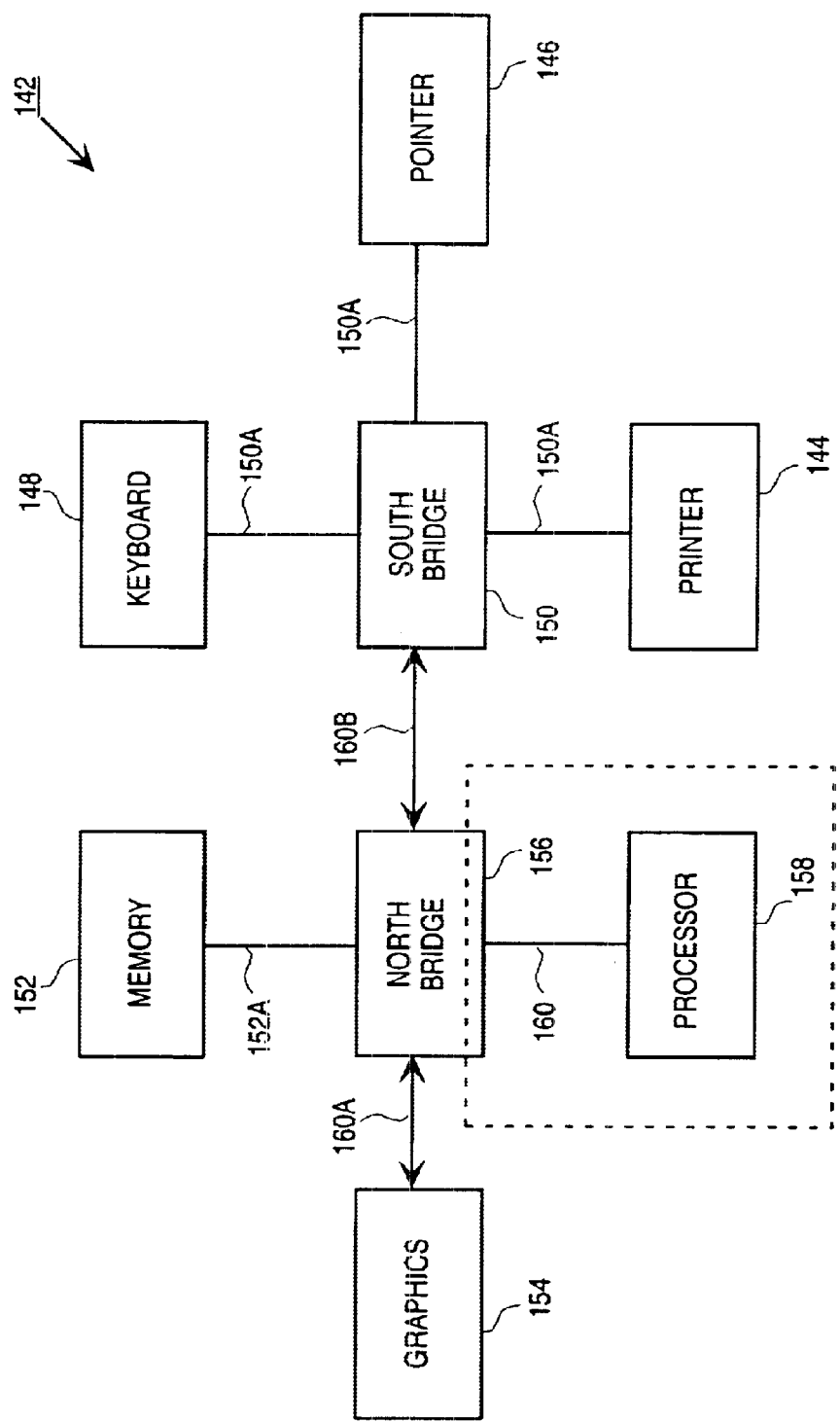
FIG. 7 shows the application of the present invention within a general purpose data processing system.

FIG. 7 shows the application of the present invention within a general-purpose data processing system. With reference to FIG. 7, general-purpose data processing system 142 might include printer 144, pointer 146, and keyboard 148, connected to south bridge 150 via bus 150a. North bridge 156 is connected to south bridge 150 via bus 160b, memory 152 via bus 152a, graphics 154 via bus 160a, and processor 158 via bus 160. Two devices on the bus 162 are shown employing an embodiment of the present invention. Encoded data bus 160 is shown between processor 158 and north bridge 156. The present invention may be used in other locations within general-purpose data processing system 142, for example bus 160a and 160b are examples of other locations in which the present invention could be employed. The present invention can be used in any situation in which data transmission occurs, the bus locations mentioned with respect to FIG. 7 are merely illustrative and are not to be construed in a limiting sense.

Figure 8:
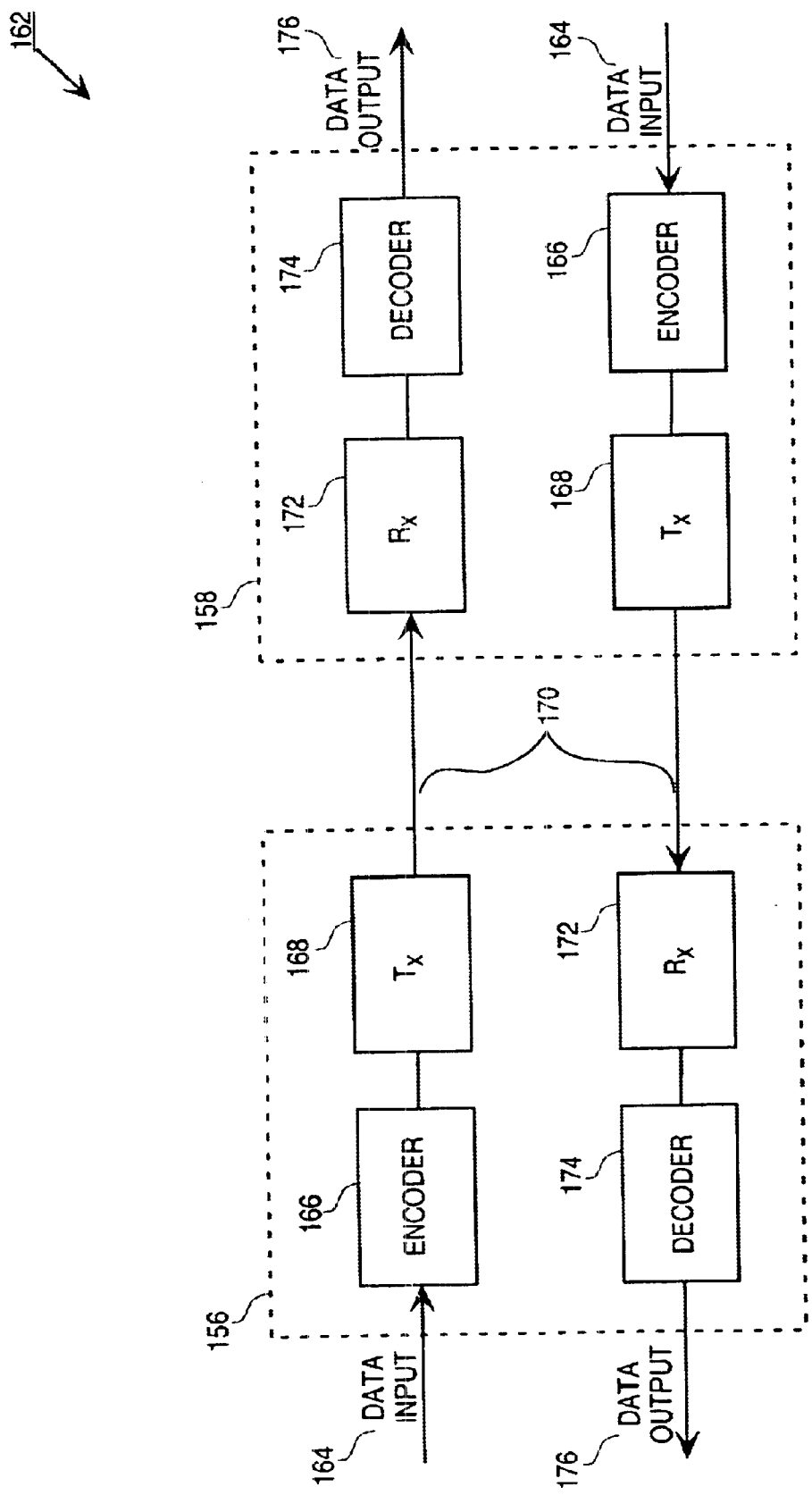
FIG. 8 is a detail representation of two devices on a parallel data line bus employing the present invention.

FIG. 8 is a detail representation of two devices on a parallel data line bus employing the present invention as seen previously in FIG. 7. With reference to FIG. 8, two devices on the bus 162 are shown employing an embodiment of the present invention. Input data word 164 could be an 18-bit data word, as previously discussed, entering encoder 166 of device-1 156. Input data word 164 would be encoded by encoder 166 and be transmitted by transmitter 168 onto parallel encoded data line bus 170 to device-2 158, also connected with parallel encoded data line bus 170. Device-2 158 may have receiver 172 and decoder 174 configured to receive and decode the encoded data word, thus outputting the data word at data output 176.

Each of the devices may employ the reciprocal ability to both receive data words as input, encode, transmit onto the parallel data lines, decode and output the data word as shown in FIG. 8.

Figure 9:
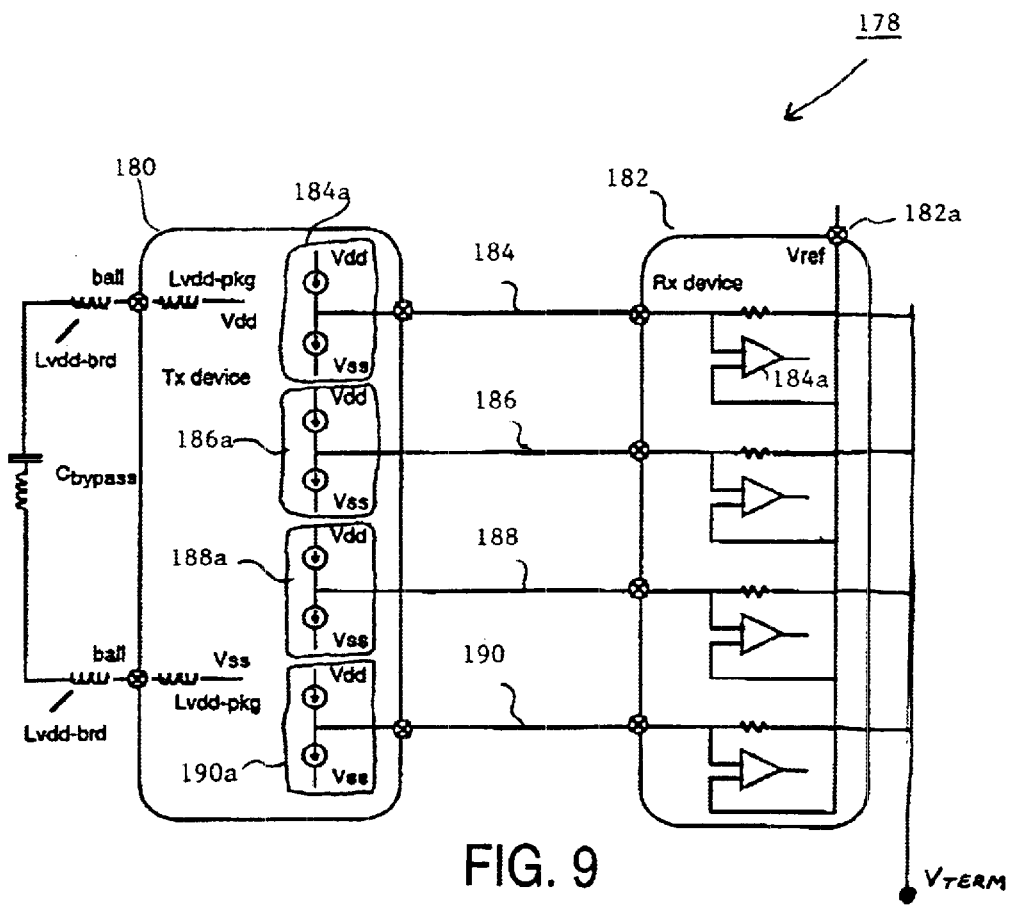
FIG. 9 shows the termination of the encoded parallel data lines according to the present invention, where less than two lines are required to transmit one bit of information.

FIG. 9 shows the termination of the encoded parallel data lines according to the present invention, where less than two lines are required to transmit one bit of information. With reference to FIG. 9, encoded line termination 178 is shown connecting transmit device 180 and receive device 182. Encoded data line 184, 186, 188, and 190 allow transmission of the encoded data word between transmit device 180 and receive device 182. Line drivers 184a, 186a, 188a, and 190a drive the encoded data lines. As previously discussed in the embodiment of the present invention directed to the encoding of an 18-bit data word, 22 total encoded data lines were used. 22 encoded data lines represents four more lines than would be required by single-ended architecture and 14 less lines than would be required by differential architecture.

Figure 10:
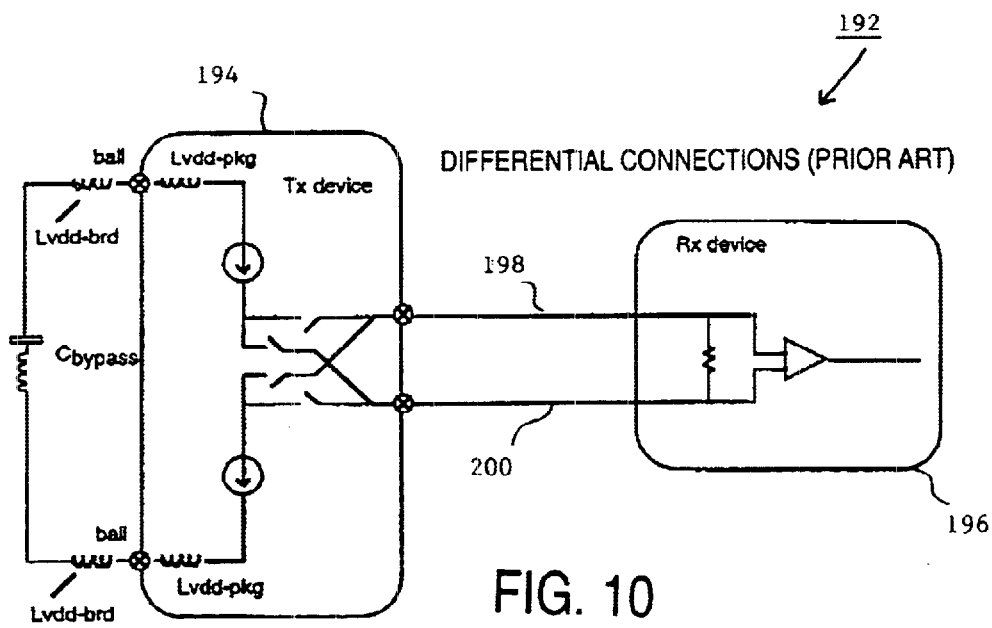
FIG. 10 depicts a prior art differential architecture termination of parallel data lines, where two lines are necessary to transmit one bit of information.

FIG. 10 depicts a prior art differential architecture termination of parallel data lines, where two lines are necessary to transmit one bit of information. With reference to FIG. 10, differential line termination 192 shows the termination necessary for two lines to connect transmit device 194 and receive device 196. Differential line 198 and differential line 200 are required to transmit one bit of information in a binary system between transmit device 194 and receive device 196.

FIG. 11 illustrates the best mode of the present invention applied to the specific case of encoding an 18-bit information word. With reference to FIG. 11, encoder 166 is shown in greater detail. Data word 202 is divided into sub-word a 204, sub-word b 206, and sub-word c 208. Sub-word a 204 is encoded by encoder a 210 resulting in encoded sub-word a 212. Sub-word a 204 includes input data lines Da0 to Da5, encoded data sub-word a 212 includes encoded data lines Ea0 to Ea6, thus six lines of input data are encoded onto seven encoded lines. Sub-word b 206 is encoded by encoder b 214 resulting in encoded sub-word b 216. Sub-word b 206 includes input data lines Db0 to Db5, encoded data sub-word b 216 includes encoded data lines Eb0 to Eb6. Sub-word c 208 is encoded by encoder c 218 resulting in encoded sub-word c 220. Sub-word c 208 includes input data lines Dc0 to Dc5, encoded data sub-word c 220 includes encoded data lines Ec0 to Ec6.

In FIG. 11, a sub-word path may be conceptualized as the path taken by the data sub-word from data word 202 on the input side of the encoder to the output side of the encoder, where the encoded sub-words merge together to form encoded data word 227. Shared information 222 flows between sub-word paths and parity logic 224. Based on shared information 222, parity logic 224 sets parity bit 226 to balance encoded data word 227. Encoded sub-word a 212, encoded sub-word b 216, encoded sub-word c 218, and parity bit 226 form encoded data word 227.

Alternative encoding, according to the best mode implementation for an 18-bit data word, requires shared information 222 to provide the value of the first and second MSB of sub-word a 204 and sub-word c 208 and the first MSB of sub-word b 206 on each sub-word path and at parity logic 224 to balance encoded data word 227. Post Inversion (PI) was applied in two cases; case one is the situation where the first MSB of each sub-word equals zero (Da5, Db5, Dc5) and the second MSB of sub-word a 204 equals zero (Da4), then encoded sub-word b 216 and encoded sub-word c 220 are inverted; case two is the situation where the first MSB of each sub-word (Da5, Db5, Dc5) equals one and the second MSB of sub-word c 208 equal one (Dc5), then encoded sub-word a 212 and encoded sub-word b 216 are inverted.

Figure 12:
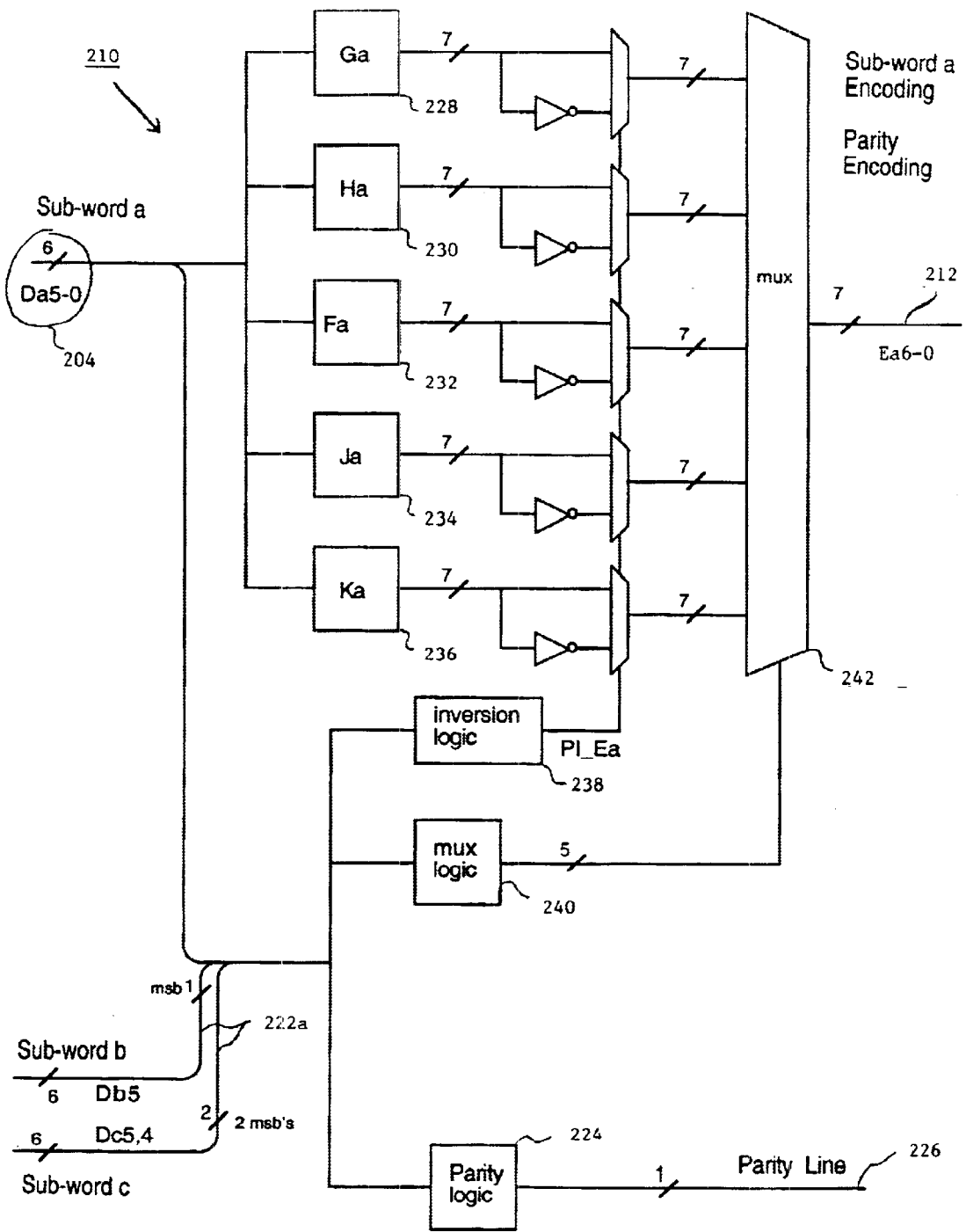
FIG. 12 is a further detail of the encoding applied to sub-word a according to the present invention.

FIG. 12 is a further detail of the encoding applied to sub-word a 204 by sub-word encoder 210 according to the present invention. With reference to FIG. 12, sub-word a 204 is encoded in parallel by Ga encoder block 228, Ha encoder block 230, Fa encoder block 232, Ja encoder block 234, and Ka encoder block 236. Shared information 222a is used by, parity logic 224 to set the state of parity bit 226, mux logic 240 to signal mux 242, and inversion logic 238 to perform post inversion for the cases requiring alternate encoding. Mux 242 together with mux logic 238 selects the encoded sub-word from Ga encoder block 228, Ha encoder block 230, Fa encoder block 232, Ja encoder block 234, or Ka encoder block 236 that is transmitted as encoded sub-word a 212.

Figure 13:
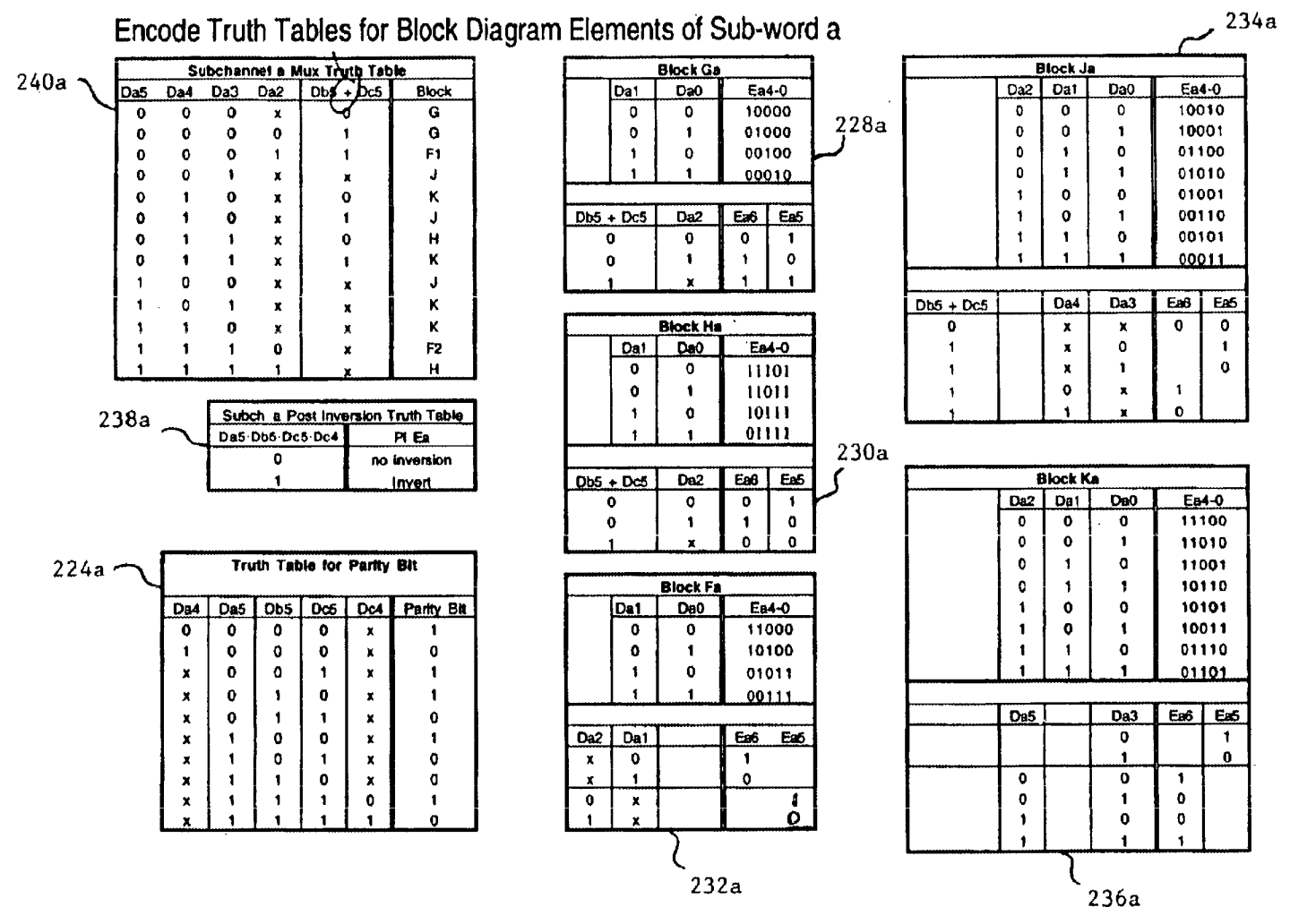

FIG. 13 shows the truth tables employed by the encoder blocks shown in FIG. 12. With reference to FIG. 13, mux truth table 240a displays the logic used by mux logic 240 (FIG. 12). Mux truth table 240a includes determination of the special cases requiring alternative encoding, the first MSB of each sub-word (Da5, Db5, Dc5) are considered in mux truth table 240a.

Distinct patterns between numbers of input least significant bits (LSBs) in the sub-words and numbers of LSBs in the encoded sub-words are used to form five unique patterns of encoding that are incorporated into the encoding blocks which have a measure of similarity across sub-words. The five distinct patterns result in Ga truth table 228a, Ha truth table 230a, Fa truth table 232a, Ja truth table 234a, and Ka truth table 236a. Ga truth table 228a is used by Ga encoder block 228 (FIG. 12). Ha Truth table 230a is used by Ha encoder block 230 (FIG. 12). Fa truth table 232a is used by Fa1, 2 encoder block 232 (FIG. 12). These three encoder blocks map the two least significant bits LSBs of sub-word a 204 (FIG. 12) into the five LSBs of the encoded sub-word. The two MSBs of the encoded sub-word may be chosen by considering a combination of the bits in sub-word a 204 (FIG. 12) and shared information 222a (Db5, Dc5, Dc4).

Ja truth table 234a is used by Ja encoder block 234 (FIG. 12), and Ka truth table 236a is used by Ka encoder block 236 (FIG. 12). These two encoder blocks map the three LSBs of sub-word a 204 (FIG. 12) into the five LSBs of the encoded sub-word.

Inversion logic truth table 238a is used by inversion logic 238 (FIG. 12) to invert encoded sub-word a 212 when alternate encoding is performed. It will be appreciated by those of skill in the art that post inversion may be performed after mux 242 (FIG. 12) as a particular application is considered. The present invention is not limited by the order of mux 242 and the inversion of encoded sub-word a 212.

Figure 14:
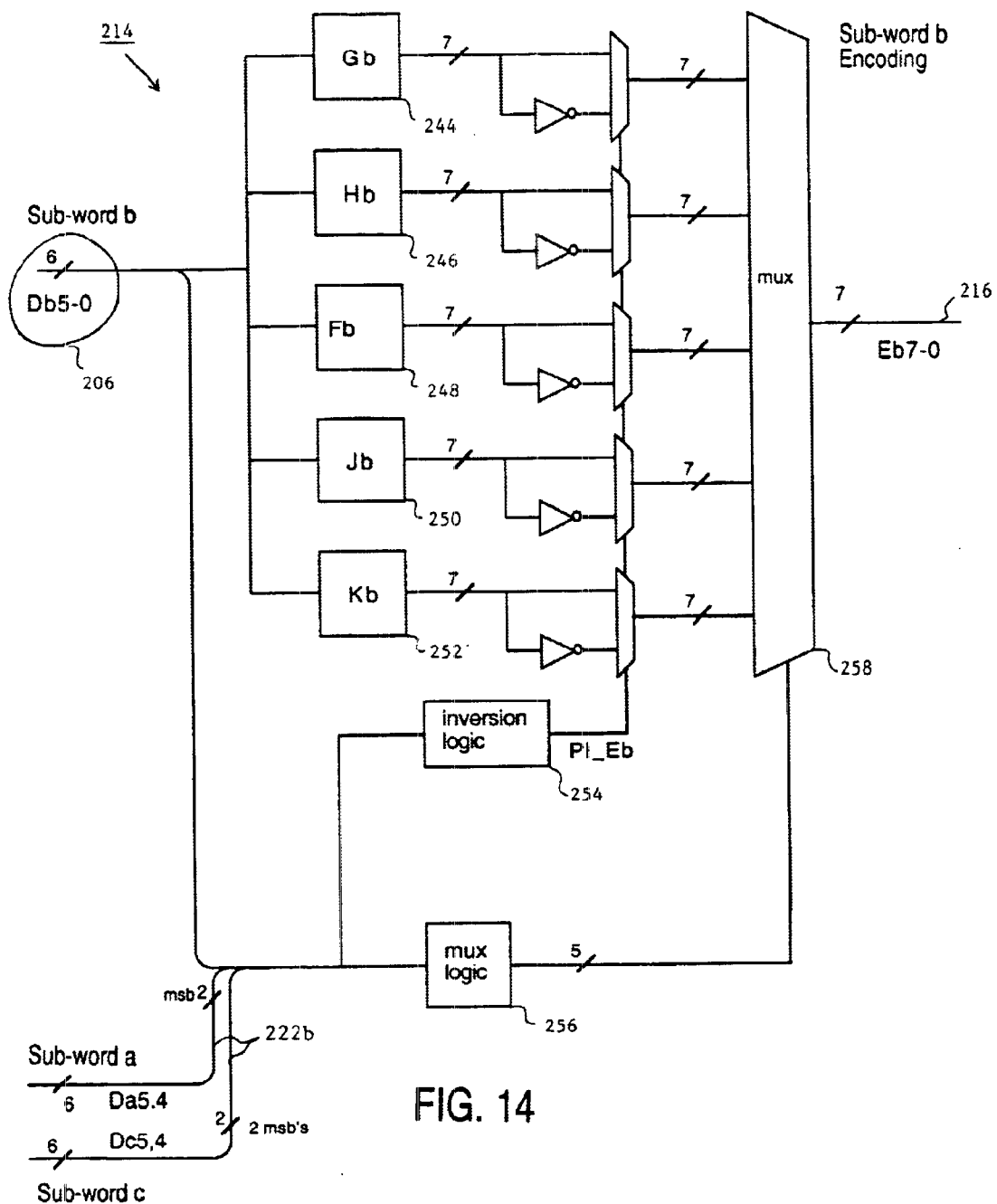
FIG. 14 is a further detail of the encoding applied to sub-word b according to the present invention.

FIG. 14 is a further detail of the encoding applied to sub-word b 206 by sub-word encoder 214 according to the present invention. With reference to FIG. 14, sub-word b 206 is encoded in parallel by Gb encoder block 244, Hb encoder block 246, Fb1, 2 encoder block 248, Jb encoder block 250, and Kb encoder block 252. Shared information 222b is used by mux logic 256 to signal mux 258 and inversion logic 254 to perform post inversion for the cases requiring alternate encoding. Mux 258 together with mux logic 256 selects the encoded sub-word from Gb encoder block 244, Hb encoder block 246, Fb1, 2 encoder block 248, Jb encoder block 250, or Kb encoder block 252 that is transmitted as encoded sub-word b 216.

FIG. 15 shows the truth tables employed by the encoder blocks shown in FIG. 14. With reference to FIG. 15, mux truth table 256b displays the logic used by mux logic 256 (FIG. 14). Gb truth table 244b is used by Gb encoder block 244 (FIG. 14). Hb truth table 246b is use by Hb encoder block 246 (FIG. 14) and Fb truth table 248b is used by Fb1, 2 encoder block 248 (FIG. 14). These three truth tables employ the same mapping between the two LSBs of the data sub-word and the five LSBs of the encoded sub-word as was used for sub-word a encoder blocks and truth tables.

Jb truth table 250b is used by Jb encoder block 250 (FIG. 14) and Kb truth table 252b is used by Kb encoder block 252 (FIG. 14). These two truth tables employ the same mapping between the three LSBs of the data sub-word and the five LSBs of the encoded sub-word as was used for sub-word a encoder blocks and truth tables.

Inversion logic truth table 254b is used by inversion logic 254 (FIG. 14) to invert encoded sub-word b 216 when alternate encoding is performed. It will be appreciated by those of skill in the art that post inversion may be performed after mux 258 (FIG. 14) as a particular application is considered. The present invention is not limited by the order of mux 258 and the inversion of encoded sub-word b 216.

Figure 16:
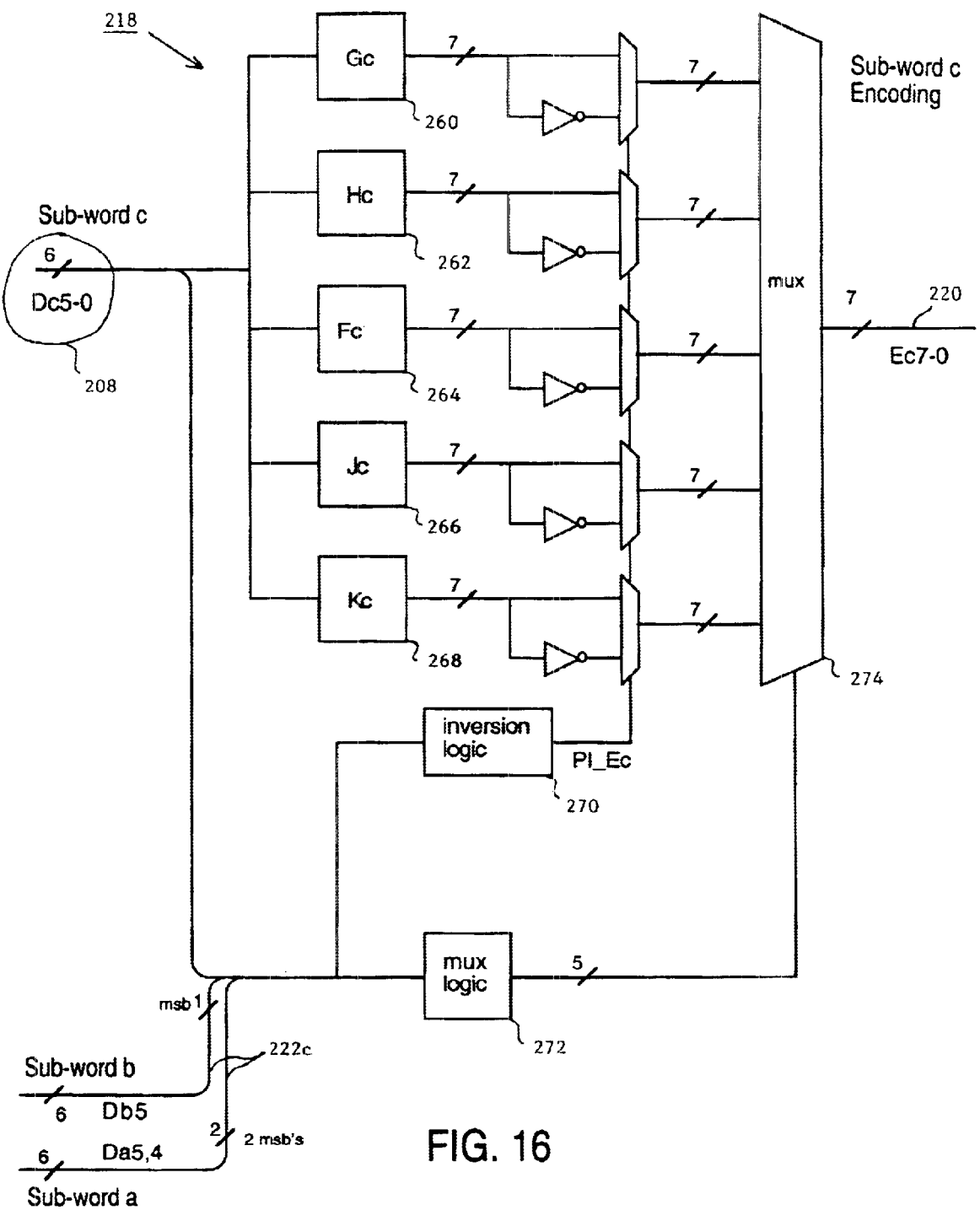
FIG. 16 is a further detail of the encoding applied to sub-word c according to the present invention.

FIG. 16 is a further detail of the encoding applied to sub-word c 208 by sub-word encoder 218 according to the present invention. With reference to FIG. 16, Sub-word c 208 is encoded in parallel by Gc encoder block 260, Hc encoder block 262, Fc1, 2 encoder block 264, Jc encoder block 266, and Kc encoder block 268. Shared information 222c is used by mux logic 272 to signal mux 274 and inversion logic 270 to perform post inversion for the cases requiring alternate encoding. Mux 274 together with mux logic 272 selects the encoded sub-word from Gc encoder block 260, Hc encoder block 262, Fc1, 2 encoder block 264, Jc encoder block 266, or Kc encoder block 268 that is transmitted as encoded sub-word c 220.

Figure 17:
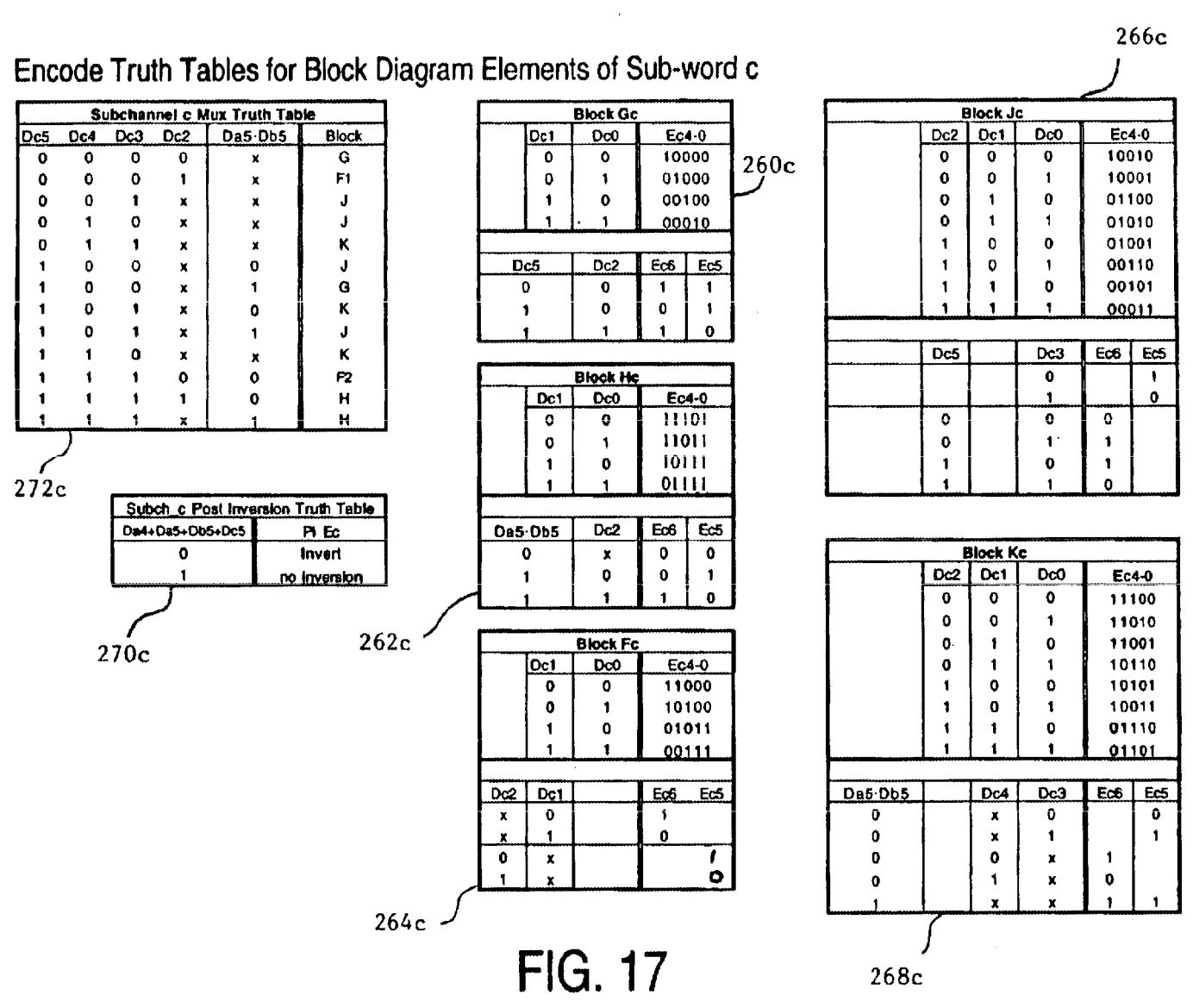

FIG. 17 shows the truth tables employed by the encoder blocks shown in FIG. 16. With reference to FIG. 17, mux truth table 272c displays the logic used by mux logic 270 (FIG. 16). Mux truth table 272c includes determination of the special cases requiring alternative encoding, the first MSB of each sub-word (Da5, Db5, Dc5) is considered in mux truth table 272c.

Gc truth table 260c is used by Gc encoder block 260 (FIG. 16). Hc truth table 262c is use by Hc encoder block 262 (FIG. 16) and Fc truth table 264c is used by encoder block Fc1, 2 264 (FIG. 16). These three truth tables employ the same mapping between the two LSBs of the data sub-word and the five LSBs of the encoded sub-word as was used for sub-word a encoder blocks and truth tables.

Jc truth table 266c is used by Jc encoder block 266 (FIG. 16) and Kc truth table 268c is used by Kc encoder block 268 (FIG. 16). These two truth tables employ the same mapping between the three LSBs of the data sub-word and the five LSBs of the encoded sub-word as was used for sub-word a encoder blocks and truth tables.

Inversion logic truth table 270c is used by inversion logic 270 (FIG. 16) to invert encoded sub-word c 220 when alternate encoding is performed. It will be appreciated by those of skill in the art that post inversion may be performed after mux 274 (FIG. 16) as a particular application is considered. The present invention is not limited by the order of mux 274 and the inversion of encoded sub-word c 220.

Figure 18:
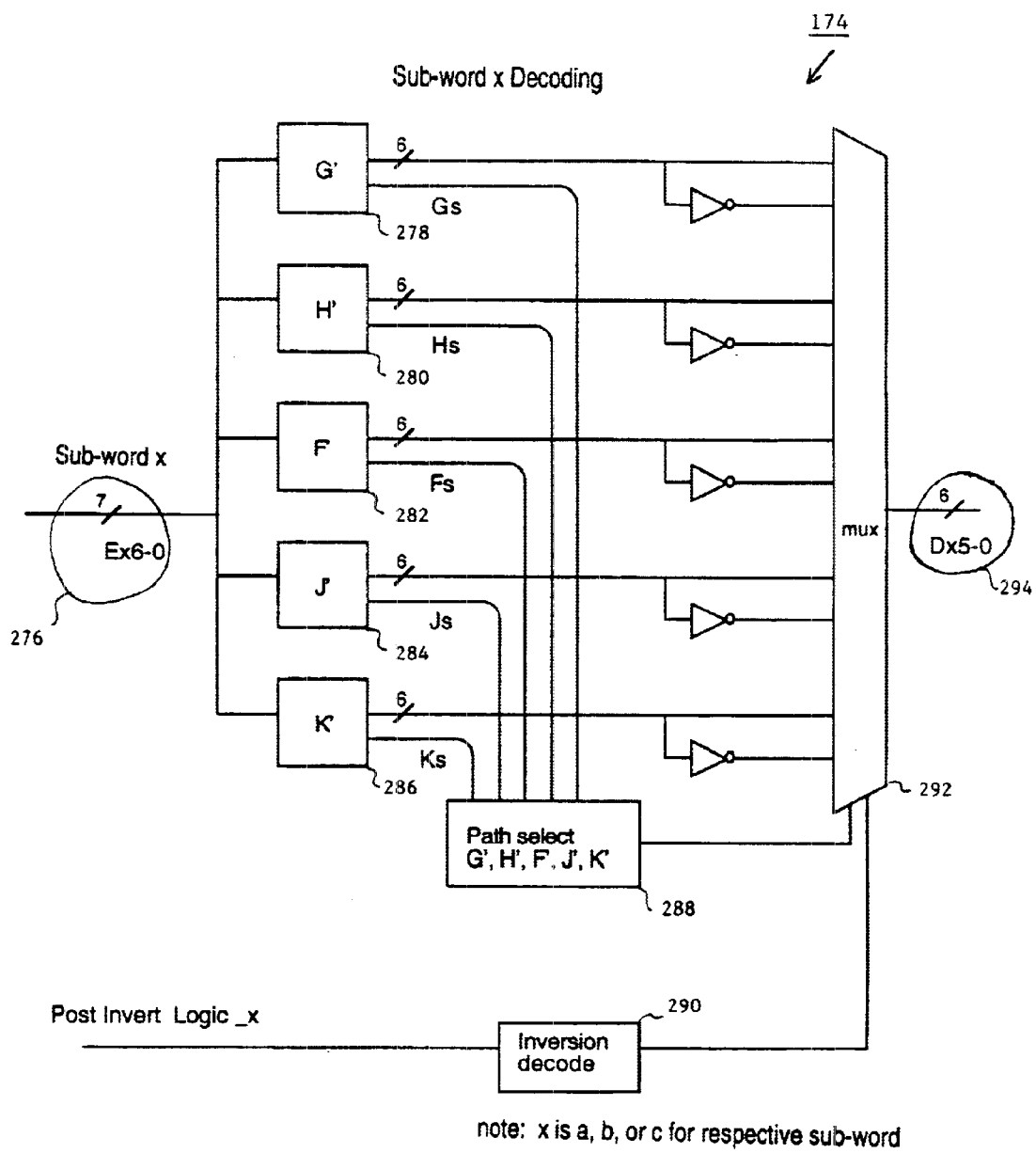
FIG. 18 is a detail of the decoding applied to a generic sub-word x, where x refers to sub-word a, b, and c.

FIG. 18 is a detail of the decoding applied to a generic sub-word x, where x refers to sub-word a, b, and c. It will be appreciated that the advantage taken of the similarity existing across sub-word encoding is also taken during encoded sub-word decoding. The five LSBs rendered by each encoder block (i.e., Ga encoder block 228, Ha encoder block 230, Fa encoder block 232, Ja encoder block 234, and Ka encoder block 236 (FIG. 12), that are used in each sub-word, are unique. This property is used for designing the decoding logic.

Decoder 174 (FIG. 8) is shown in greater detail in FIG. 18. With reference to FIG. 18, when a valid five LSB line state is detected on one of the decoder blocks (G' decode block 278, H' decode block 280, F' decode block 282, J' decode block 284, or K' decode block 286) it will be the only valid input line state over all decoder blocks. Detection of this valid input line state drives decode mux 292 which selects the decode block that produced the valid line state.

FIG. 19 shows the truth tables employed by the decoder blocks shown in FIG. 18 for encoded sub-word (x=a) 276. With reference to FIG. 19, reverse truth tables are created for decoding, G' decode truth table 278a is used to decode the encoding performed by Ga encode truth table 228a (FIG. 13). H' decode truth table 280a is used to decode the encoding performed by Ha encode truth table 230a (FIG. 13). F' decode truth table 282a is used to decode the encoding performed by Fa encode truth table 232a (FIG. 13). J' decode truth table 284a is used to decode the encoding performed by Ja encode truth table 234a (FIG. 13). K' decode truth table 286a is used to decode the encoding performed by Ka encode truth table 236a (FIG. 13). In a similar way decode truth tables are created for sub-words b and c based on the corresponding encoding truth tables.

The conventions used in sub-word a decode truth table 296 (FIG. 19), sub-word b decode truth table 298 (FIG. 20), and sub-word c decode truth table 300 (FIG. 21) are as follows:

| | |
|---|---|
| A • B | Both A and B are true; |
| A + B | either A or B or both A and B are true; |
| xor | Only A or B are true, but not both A and B are true; |
| A_ | Invert the value of A. |

Returning to the example above, where mux 292 (FIG. 18) selected the appropriate decode block, for the given unique line state, the decoded sub-word is determined from the corresponding truth table entries using the conventions previously listed.

For example, if the valid line state caused mux 292 (FIG. 18) to select the first entry in G' decode truth table 278a, the decoded value returned would be "0 0 0 Ea5_0 0, " where Ea5_ indicates the inverse of the encoded bit.

The code mappings are chosen such that there is symmetry with respect to inversion. An encoded sub-word can be decoded as described or if the encoded sub-word is inverted it can be decoded as described and then inverted and the correct decoded sub-word will be obtained. Thus, "invert-decode-invert" yields the same result as "decode."

With reference to FIG. 19, inversion logic 290a inverts decoded sub-word (x=a) 294 (FIG. 18) when the weight of encoded sub-word c 220 (FIG. 16) equals five by signaling invert decoded result 290 (FIG. 18).

FIG. 20 shows the truth tables employed by the decoder blocks shown in FIG. 18 for encoded sub-word b (x=b) 276. With reference to FIG. 20, reverse truth tables are created for decoding, G' decode truth table 278b is used to decode the encoding performed by Gb encode truth table 244b (FIG. 15). H' decode truth table 280b is used to decode the encoding performed by Hb encode truth table 246b (FIG. 15). F' decode truth table 282b is used to decode the encoding performed by Fb encode truth table 248b (FIG. 15). J' decode truth table 284b is used to decode the encoding performed by Jb encode truth table 250b (FIG. 15). K' decode truth table 286b is used to decode the encoding performed by Kb encode truth table 252b (FIG. 15).

Inversion logic 290b inverts decoded sub-word (x=b) 294 (FIG. 18) when the weight of encoded sub-word c 220 (FIG. 16) equals five or if the weight of sub-word a 212 (FIG. 12) equals two.

FIG. 21 shows the truth tables employed by the decoder blocks shown in FIG. 18 for encoded sub-word (x=c) 276. In a similar way decode truth tables are created for sub-word c based on the corresponding encoding truth tables. With reference to FIG. 21, reverse truth tables are created for decoding, G' decode truth table 278c is used to decode the encoding performed by Gc encode truth table 260c (FIG. 17). H' decode truth table 280c is used to decode the encoding performed by Hc encode truth table 262c (FIG. 17). F' decode truth table 282c is used to decode the encoding performed by Fc encode truth table 264c (FIG. 17). J' decode truth table 284c is used to decode the encoding performed by Jc encode truth table 266c (FIG. 17). K' decode truth table 286c is used to decode the encoding performed by Kc encode truth table 268c (FIG. 17).

Inversion logic 290c inverts decoded sub-word (x=c) 294 (FIG. 18) when the weight of encoded sub-word a 212 (FIG. 12) equals two.

Figure 22:
FIG. 22 is an alternative embodiment for encoding, using binomial coefficient matrix encoding, comparing the decimal value, binary value, and the encoded value for integer numbers ranging from zero to 19.

FIG. 22 is an alternative embodiment for encoding binary numbers, with reference to FIG. 22, binomial coefficient matrix encoding 302 displays the results of binomial encoding, comparing decimal value 304, binary value 306, and encoded value 308 for integer numbers ranging from zero to 19.

Figure 23:
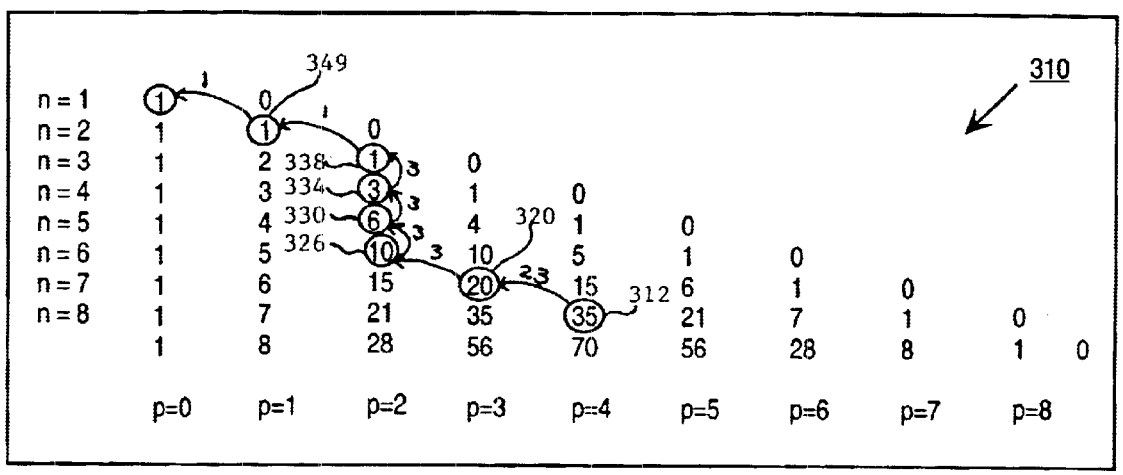
FIG. 23 is an example of binomial coefficient matrix encoding for the decimal value 58.

FIG. 23 is an alternative embodiment of encoding binary numbers using the principle of binomial expansion. With reference to 310 of FIG. 23, the following recurrence relation hold true for all binomial coefficients.

$$(n)_p = (n-1)_p + (n-1)_{p-1}.$$

n is the length of the encoded codeword and p is the number of ones in the encoded codeword. The recurrence relation partitions the span of an n-bit codeword weight p into two contiguous sub-ranges. The codebook interpretation is the following. The first sub-range are those codewords that have a zero in the $n^{th}$ bit position and p ones in the remaining n−1 bit positions. There are $(n-1)_p$ such codewords in the n-bit codeword of constant weight p ones in the remaining n−1 bit position. There are $(n-1)_p$ such codewords in the n-bit codeword of constant weight p. The second range defines those codewords that have a one in the $n^{th}$ bit position and p−1 ones in the remaining n−1 bit positions. There are $(n-1)_{p-1}$ of these codewords in the n bit codeword of constant weight p.

To convert the information content of a binary number to an n-bit codeword of constant weight p, the binary number is compared to $(n-1)_p$. If it is smaller, then the $n^{th}$ bit is set to zero. If it is greater, then the $n^{th}$ bit is set to one. The procedure is applied recursively with three restrictions.

1. For the case where the $n^{th}$ bit is set to one, the original binary number must be numerically adjusted downward into a number range for which it can be computed as an n−1 bit codeword of constant weight p−1. This numerical adjustment is done by subtracting $(n-1)_p$.

2. The algorithm does not work for the all-zero binary codeword. To compensate, all binary numbers can be increased by one, or the all-zero codeword can be mapped to an unused binary value such as $(n)_{p+1}$ 3. 35 $(n)_0$ equal one for any non-negative integer value of n.

4. $(n)_p$ equals zero when p is larger than p.

To speed up the conversion process, it is desirable to pre-compute the binomial coefficients and store them in a table or codebook such as the one shown in 310 of FIG. 23. To encode the 6-bit binary number 57 into a 8-bit constant-weight code of weight four, the process is as follows. The first step is to compare 58 to $(7)_4$ which is found in the table of FIG. 23 at 312 and returns the numerical value 35. The first bit is then set to one and the algorithm is applied recursive by comparing 58−35+23 to $(6)_3$ Note that the original number 58 is down shifted to 23, and the codeword length and number of ones remaining in the codeword are both reduced by one.

The value of $(6)_3$ is looked up in the codebook at 320. The numerical value is 20. The second bit is then set to one and the algorithm is applied recursive by comparing 23−20=3 to $(5)_2$. The next three recursion are for $(5)_2$, $(4)_2$, and $(3)_2$, found at locations 326, 330, and 334 in the codebook. For each recursion, the values are larger than 3, so the next three bits are all zero. For $(2)_2$ at 338 in the codebook, the value is 1 which is less than 3. The new number is 3−1=2, the codeword length and the number of ones remaining in the codeword are reduced by one and the sixth bit is set to one. The next value to compare is $(1)_1$ at 349 which is greater than 2. The new number is 2−1=1, the codeword length and the number of ones remaining in the codeword are reduced by one, and the seventh bit is set to one. The next value to compare is $(0)_1$ which is equal than 1. The eighth bit is set to zero and the algorithm stops. The conversion of the numerical value 58 results in a codeword of 11000110 as shown in 310b of FIG. 23. Note that this value equals the sum of the codebook entries when the number was greater than the codebook entry, $$11000110=(7)_4+(6)_3+(2)_2+(1)_1=35+20+2+1=58.$$

In the foregoing specification, the invention has been described with reference to specific embodiment thereof. It will be, however, evident that various modifications and changes may be made thereto without departing from the broader scope and spirit of the invention. The specification and drawings are, accordingly, to be regarded in an illustrative rather than restrictive sense.

What is claimed is:

1. A method comprising:
dividing a data word into data sub-words; and
encoding the data sub-words into corresponding encoded data sub-words of an encoded data word, a first sub-word of the data sub-words being encoded using information carried in the first sub-word and in the data sub-words other than the first sub-word, the data sub-words having less data elements than the encoded data word.

2. A method comprising:
decoding encoded data sub-words of an encoded data word into corresponding data sub-words of a decoded data word, a first sub-word of the encoded data sub-words being decoded using information carried in the first sub-word and in the encoded data sub-words other than the first sub-word, the encoded data sub-words having more data elements than the decoded data word.

3. An encoder module to encode a data word, whose data elements occupy at least a first logic state and a second logic state, said encoder module comprising:
at least two sub-word paths, each of said at least two sub-word paths to receive a data sub-word comprising a set of data elements of the data word, the data sub-words on said at least two sub-word paths comprising the data word; and
an encoder coupled with said at least two sub-word paths, said encoder to encode the data sub-word on each of said at least two sub-word paths into a corresponding encoded data sub-word of an encoded data word using the data sub-word and information in the data word that is not carried in the data sub-word.

4. An encoder module, as in claim 3, wherein the data sub-word on each of said at least two sub-word paths has less data elements than the corresponding encoded data sub-word.

5. An encoder module, as in claim 4, wherein the information is a data sub-word weight.

6. An encoder module, as in claim 4, wherein the information is at least one data element from the data sub-word on one of said at least two sub-word paths.

7. An encoder module, as in claim 4, wherein the information is at least one data element from the data word.

8. An encoder module as recited in claim 4, wherein said encoder inverts all the data elements of the data sub-word on a first path of said at least two sub-word paths in response to a determination based at least in part on information in the data word that is not carried in the data sub-word on the first path.

9. An encoder module as recited in claim 4, wherein said encoder inverts all data elements of a code word encoded from the data sub-word on a first path of said at least two sub-word paths to generate the corresponding encoded data sub-word in response to a determination based at least in part on information in the data word that is not carried in the data sub-word on the first path.

10. An encoder module as recited in claim 4, wherein said encoder determines the corresponding encoded data sub-word for the data sub-word on a first path of said at least two sub-word paths from a plurality of code words based at least in part on information in the data word that is not carried in the data sub-word on the first path; and, wherein the plurality of code words are encoded from the data sub-word on the first path.

11. An encoder module, as in claim 10, wherein said encoder encodes the data sub-word on the first path from selecting one from the plurality of code words based at least in part on information in the data word that is not carried in the data sub-word on the first path.

12. An encoder module, as in claim 4, further comprising a code governor, wherein said code governor sets a logic state of at least one particular data element of the encoded data word such that the number of data elements in each logic state is constant for each encoded data word.

13. An encoder module, as recited in claim 12, wherein said code governor uses, in part, the information to set the logic state of the at least one particular data element in the encoded data word.

14. An encoder module, as in claim 12, wherein said code governor comprises a parity line to change the weight of the encoded data word by setting a logic state of a first element of the at least one particular data element in the encoded data word.

15. An encoder module, as recited in claim 14, wherein said parity line uses, in part, the information to set the logic state of the first element.

16. An encoder module as recited in claim 4, wherein said encoder encodes the data word such that a number of data elements in each logic state in the encoded data word is predetermined.

17. An encoder module as recited in claim 4, wherein said encoder encodes each data sub-word by associating the data sub-word with an encoded data sub-word in a user defined way.

18. An encoder module as recited in claim 4, wherein said encoder binomially encodes the data sub-words on each of said at least two sub-word paths.

19. An encoder module as recited in claim 4, wherein said encoder module is disposed on an integrated circuit die.

20. An encoder module, as in claim 4, wherein a total current in a Vdd power rail for driving data elements of the encoded data word on a non-differential bus is substantially constant for each encoded data word.

21. An encoder module, as in claim 4, wherein said encoder sets a logic state of at least one particular data element of the encoded data word, such that a total current in a Vdd power rail for driving data elements of the encoded data word on a non-differential bus is substantially constant for each encoded data word.

22. An encoder module, as in claim 21, wherein said encoder uses in part the information to set the logic state of the at least one particular data element in the encoded data word.

23. An encoder module, as in claim 21, wherein said encoder comprises a parity line to change the weight of the encoded data word by setting a logic state of a first element of the at least one particular data element in the encoded data word.

24. An encoder module, as in claim 23, wherein the information is used, in part, to set the logic state of the first element.

25. An encoder module, as in claim 4, wherein a total current in a Vss power rail for driving data elements of the encoded data word on a non-differential bus is substantially constant for each encoded data word.

26. An encoder module, as in claim 4, wherein said encoder sets the logic state of at least one particular data element of the encoded data word, such that a total current in a Vss power rail for driving data elements of the encoded data word on a non-differential bus is substantially constant for each encoded data word.

27. An encoder module, as in claim 26, wherein said encoder uses in part the information to set the logic state of the at least one particular data element in the encoded data word.

28. An encoder module, as in claim 26, wherein the encoder comprises a parity line to change the weight of the encoded data word by setting a logic state of a first element of the at least one particular data element in the encoded data word.

29. An encoder module, as recited in claim 28, wherein the information is used, in part, to set the logic state of the first element.

30. An encoder module, as in claim 4, further comprising non-differential data lines for transmitting data elements of the encoded data word; wherein a total current flowing in said data lines is substantially constant for each encoded data word.

31. An encoder module, as in claim 4, wherein said encoder sets a logic state of at least one particular data element of the encoded data word such that a total current flowing in non-differential data lines for transmitting data elements of the encoded data word is substantially constant for each encoded data word.

32. An encoder module, as in claim 31, wherein said encoder uses in part the information to set the logic state of the at least one particular data element in the encoded data word.

33. An encoder module, as in claim 31, wherein said encoder comprises a parity line to change the weight of the encoded data word by setting a logic state of a first element of the at least one particular data element in the encoded data word.

34. An encoder module, as in claim 33, wherein the information is used, in part, to set the logic state of the first element.

35. A method of encoding a data word, whose data elements occupy at least a first logic state and a second logic state, said method comprising:
receiving data sub-words of the data word, each of the data sub-words comprising a set of data elements of the data word, the data sub-words comprising the data word; and
encoding the data sub-words into corresponding encoded data sub-words of an encoded data word, a first sub-word of the data sub-words being encoded using the first sub-word and information carried in the data sub-words other than the first sub-word.

36. A method, as in claim 35, wherein each of the data sub-words has less data elements than the corresponding encoded data sub-word.

37. A method, as in claim 36, wherein the information is a data sub-word weight.

38. A method, as in claim 36, wherein the information is at least one data element from the data sub-words other than the first sub-word.

39. A method, as in claim 36, wherein the information is at least one data element from the data word; and wherein the at least one data element is not in the first sub-word.

40. A method, as in claim 36, wherein said encoding further comprises inverting all data elements of the first sub-word in response to a determination based at least in part on the information.

41. A method, as in claim 36, wherein said encoding further comprises inverting all data elements of a code word encoded from the first sub-word to generate the corresponding encoded data sub-word for the first sub-word in response to a determination based at least in part on the information.

42. A method, as in claim 36, wherein said encoding encodes a data word such that a number of data elements in each logic state in the encoded data word is predetermined.

43. A method, as in claim 36, wherein said encoding encodes each data sub-word by associating the data sub-word with an encoded data sub-word in a user defined way.

44. A method, as in claim 36, wherein the encoded data word is balanced.

45. A method, as in claim 36, wherein the encoded data word is substantially balanced.

46. A method, as in claim 36, further comprising setting a logic state of at least one data element of the encoded data word such that a number of the data elements in each logic state is predetermined.

47. A method, as in claim 46, wherein said setting is based at least in part on the information.

48. A method, as in claim 46, wherein said setting comprises determining a logic state of a parity element of the encoded data word; and wherein the at least one data element includes the parity element.

49. A method, as in claim 48, wherein the logic state of the parity element is determined based at least in part on the information.

50. A method, as in claim 36, wherein each of the data sub-words is binomially encoded.

51. A method, as in claim 50, wherein said encoding comprises adding 1 to a number to be encoded.

52. A method, as in claim 50, wherein the encoded data word is balanced.

53. A method, as in claim 50, wherein the encoded data word is substantially balanced.

54. A method, as in claim 50, further comprising setting a logic state of at least one data element of the encoded data word such that a number of the data elements in each logic state is predetermined.

55. A method, as in claim 54, wherein said setting is based at least in part on the information.

56. A method, as in claim 54, wherein said setting comprises determining a logic state of a parity element of the encoded data word; and wherein the at least one data element includes the parity element.

57. A method, as in claim 56, wherein the logic state of the parity element is determined based at least in part on the information.

58. A decoder module to decode an encoded data word, whose encoded data elements occupy at least a first logic state and a second logic state, said decoder module comprising:
    at least two sub-word paths, each of said at least two sub-word paths to receive an encoded data sub-word comprising a set of data elements of the encoded data word, the encoded data sub-words on said at least two sub-word paths comprising the encoded data word; and
    a decoder coupled with said at least two sub-word paths, said decoder to decode the encoded data sub-word on each of said at least two sub-word paths into a corresponding data sub-word of a data word using the encoded data sub-word and information in the encoded data word that is not carried in the encoded sub-word, the encoded data sub-word on each of said at least two sub-word paths having less data elements than the corresponding data sub-word.

59. A decoder module as recited in claim 58, wherein said decoder inverts all data elements of a code word decoded from the encoded sub-word on a first path of said at least two sub-word paths to generate the corresponding data sub-word in response to a determination based at least in part on information in the encoded data word that is not carried in the encoded data sub-word on the first path.

60. A decoder module as recited in claim 58, wherein said decoder inverts all data elements of the encoded data sub-word on a first path of said at least two sub-word paths in response to a determination based at least in part on information in the encoded data word that is not carried in the data sub-word on the first path.

61. A decoder module as recited in claim 58, wherein said decoder determines the corresponding data sub-word for the encoded data sub-word on a first path of said at least two sub-word paths from a plurality of code words based at least in part on information in the encoded data word that is not carried in the encoded data sub-word on the first path; and, wherein the plurality of code words are decoded from the encoded data sub-word on a first path.

62. A decoder module, as in claim 61, wherein said decoder decodes the encoded data sub-word on the first path from selecting one from the plurality of code words based at least in part on information in the encoded data word that is not carried in the encoded data sub-word on the first path.

63. A decoder as recited in claim 58, wherein said decoder decodes each encoded data sub-word by associating the encoded data sub-word with a data sub-word in a user-defined way.

64. A decoder as recited in claim 58, wherein said decoder binomially decodes each of the encoded data sub-words.

65. A decoder module, as in claim 58, wherein said decoder module is disposed on an integrated circuit die.

66. A method of decoding an encoded data word, whose encoded data elements occupy at least a first logic state and a second logic state, said method comprising:
    receiving encoded data sub-words of the encoded data word, each of the encoded data sub-words comprising a set of data elements of the encoded data word, the encoded data sub-words comprising the encoded data word; and
    decoding the encoded data sub-words into corresponding data sub-words of a data word, a first sub-word of the encoded data sub-words being decoded using the first sub-word and information carried in the encoded data sub-words other than the first sub-word.

67. A method, as in claim 66, wherein the information is an encoded data sub-word weight.

68. A method, as in claim 66, wherein the information is at least one data element from the encoded data sub-words other than the first sub-word.

69. A method, as in claim 66, wherein the information is at least one data element from the encoded data word; and wherein the at least one data element is not in the first sub-word.

70. A method, as in claim 66, wherein said method further comprises inverting all data elements of the first sub-word in response to a determination based at least in part on the information.

71. A method, as in claim 66, wherein said method further comprises inverting all data elements of a code word decoded from the first sub-word to generate the corresponding data sub-word for the first sub-word in response to a determination based at least in part on the information.

72. A method, as in claim 66, wherein said decoding decodes each encoded data sub-word by associating the encoded data sub-word with a data sub-word in a user defined way.

73. A method, as in claim 66, wherein each of the encoded data sub-words is binomially decoded.

74. A method, as in claim 73, wherein said decoding comprises adding 1 to a value to be decoded.

75. A data processing system comprising:
    an encoder to encode data sub-words of a data word into corresponding encoded data sub-words of an encoded data word, a first sub-word of the data sub-words being encoded into a second sub-word of the encoded data sub-words using the first sub-word and information carried in the data sub-words other than the first sub-word;
    a plurality of parallel data lines coupled with said encoder to receive the encoded data word and to facilitate transmission of the encoded data word; and
    a decoder coupled with the plurality of data lines to receive the encoded data sub-words of the encoded data word transmitted from said encoder, said decoder to decode the encoded data sub-words into the data sub-words.

76. A data processing system, as in claim 75, wherein each of the data sub-words has less data elements than the corresponding encoded data sub-word.

77. A data processing system, as in claim 76, wherein the information is a data sub-word weight.

78. A data processing system, as in claim 76, wherein the information is at least one data element from the data sub-words other than the first sub-word.

79. A data processing system, as in claim 76, wherein the information is at least one data element from the data word.

80. A data processing system, as in claim 76, wherein said encoder inverts all the data elements of the first sub-word in response to a determination based at least in part on the information.

81. A data processing system, as in claim 76, wherein said encoder inverts all data elements of a third sub-word encoded from the first sub-word to generate the second sub-word in response to a determination based at least in part on the information.

82. A data processing system, as in claim 76, wherein the second sub-word is determined from a plurality of code words based at least in part on the information; and, wherein the plurality of code words are encoded from the first sub-word.

83. A data processing system, as in claim 82 wherein the second sub-word is selected from the plurality of code words based at least in part on the information.

84. A data processing system, as in claim 76, wherein said encoder sets a logic state of at least one particular data element of the encoded data word such that the number of data elements in each logic state is constant for each encoded data word.

85. A data processing system, as in claim 84, wherein said encoder uses in part the information to set the logic state of the at least one particular data element in the encoded data word.

86. A data processing system, as in claim 84, wherein the at least one particular element comprises a parity element.

87. A data processing system, as in claim 86, wherein said encoder uses in part the information to set a logic state of the parity element.

88. A data processing system, as in claim 76, wherein said encoder encodes the data word such that a number of data elements in each logic state in the encoded data word is predetermined.

89. A data processing system, as in claim 76, wherein said encoder encodes each data sub-word by associating the data sub-word with an encoded data sub-word in a user defined way.

90. A data processing system, as in claim 76, wherein said encoder binomially encodes each of the data sub-words.

91. A data processing system as recited in claim 76, wherein said encoder is disposed on an integrated circuit die.

92. A data processing system, as in claim 76, wherein a total current for driving data elements of the encoded data word on the plurality of data lines in a Vdd power rail is substantially constant; and wherein each data element of the encoded data word is transmitted through less than two of the plurality of data lines.

93. A data processing system, as in claim 76, wherein said encoder sets a logic state of at least one particular data element of the encoded data word, such that a total current for driving data elements of the encoded data word on the plurality of data lines in a Vdd power rail is substantially constant; and wherein each data element of the encoded data word is transmitted through less than two of the plurality of data lines.

94. A data processing system, as in claim 93, wherein said encoder uses in part the information to set the logic state of the at least one particular data element in the encoded data word.

95. A data processing system, as in claim 93, wherein the at least one particular element comprises a parity element.

96. A data processing system, as in claim 95, wherein the information is used, in part, to set a logic state of the parity element.

97. A data processing system, as in claim 76, wherein a total current for driving data elements of the encoded data word on the plurality of data lines in a Vss power rail is substantially constant; and wherein each data element of the encoded data word is transmitted through less than two of the plurality of data lines.

98. A data processing system, as in claim 76, wherein said encoder sets a logic state of at least one particular data element of the encoded data word, such that a total current for driving data elements of the encoded data word on the plurality of data lines in a Vss power rail is substantially constant; and wherein each data element of the encoded data word is transmitted through less than two of the plurality of data lines.

99. A data processing system, as in claim 98, wherein said encoder uses in part the information to set the logic state of the at least one particular data element in the encoded data word.

100. A data processing system, as in claim 98, wherein the at least one particular element comprises a parity element.

101. A data processing system, as in claim 100, wherein the information is used, in part, to set a logic state of the parity element.

102. A data processing system, as in claim 76, wherein a total current in the plurality of data lines is substantially constant; and wherein each data element of the encoded data word is transmitted through less than two of the plurality of data lines.

103. A data processing system, as in claim 76, wherein said encoder sets a logic state of at least one particular data element of the encoded data word, such that a total current in the plurality of data lines is substantially constant; and wherein each data element of the encoded data word is transmitted through less than two of the plurality of data lines.

104. A data processing system, as in claim 103, wherein said encoder uses in part the information to set the logic state of the at least one particular data element in the encoded data word.

105. A data processing system, as in claim 103, wherein the at least one particular element comprises a parity element.

106. A data processing system, as in claim 105, wherein the information is used, in part, to set a logic state of the parity element.

107. A data processing system, as in claim 76, wherein said decoder inverts all data elements of a code word to generate a third sub-word of the data sub-words from a fourth sub-word of the encoded data sub-words in response to a determination based at least in part on information in the encoded data sub-words other than the fourth sub-word.

108. A data processing system, as in claim 76, wherein said decoder inverts all data elements of a fourth sub-word of the encoded data sub-words to generate a third sub-word of the data sub-words in response to a determination based at least in part on information in the encoded data sub-words other than the fourth sub-word.

109. A data processing system, as in claim 76, wherein said decoder determines a third sub-word of the data sub-words from a plurality of code words based at least in part on the information in the encoded data sub-words other than a fourth sub-word of the encoded sub-words; and, wherein the plurality of code words are decoded from the fourth sub-word.

110. A data processing system, as in claim 109 wherein said decoder determines the third sub-word from selecting one from the plurality of code words.

111. A data processing system, as in claim 76, wherein said decoder decodes each encoded data sub-word by associating the encoded data sub-word with a data sub-word in a user-defined way.

112. A data processing system, as in claim 76, wherein said decoder binomially decodes each of the encoded data sub-words.

113. A data processing system, as in claim 76, wherein said data processing system is disposed on an integrated circuit die.

114. A method for transmitting a data word in a data processing system, said method comprising:

encoding data sub-words of the data word into corresponding encoded data sub-words of an encoded data word, a first sub-word of the data sub-words being encoded into a second sub-word of the encoded data sub-words using the first sub-word and information carried in the data sub-words other than the first sub-word;

transmitting the encoded data word over a parallel data lines; and decoding the encoded data sub-words into the data sub-words respectively.

115. A method, as in claim 114, wherein each of the data sub-words has less data elements than the corresponding encoded data sub-word.

116. A method, as in claim 115, wherein the information is a data sub-word weight.

117. A method, as in claim 115, wherein the information is at least one data element from the data sub-words other than the first sub-word.

118. A method, as in claim 115, wherein the information is at least one data element from a data word; and wherein the at least one data element is not in the first sub-word.

119. A method, as in claim 115, wherein said encoding further comprises inverting all data elements of the first sub-word in response to a determination based at least in part on the information.

120. A method, as in claim 115, wherein said encoding further comprises inverting all data elements of a code word encoded from the first sub-word to generate the second data sub-word in response to a determination based at least in part on the information.

121. A method, as in claim 115, wherein said encoding encodes the data word such that a number of data elements in each logic state in the encoded data word is predetermined.

122. A method, as in claim 115, wherein said encoding encodes each data sub-word by associating the data sub-word with an encoded data sub-word in a user defined way.

123. A method, as in claim 115, wherein the encoded data word is balanced.

124. A method, as in claim 115, wherein the encoded data word is substantially balanced.

125. A method, as in claim 115, further comprising setting a logic state of at least one particular data element of the encoded data word such that a number of data elements in each logic state in the encoded data is predetermined.

126. A method, as in claim 125, wherein said at least one particular data element is set based at least in part on the information.

127. A method, as in claim 125, wherein the at least one particular element comprises a parity element.

128. A method, as in claim 127, wherein said parity element is set based at least in part on the information.

129. A method, as in claim 115, wherein said encoding binomially encodes each of the data sub-words of the data word.

130. A method, as in claim 129, wherein said encoding comprises adding 1 to a number to be encoded.

131. A method, as in claim 129, wherein the encoded data word is balanced.

132. A method, as in claim 129, wherein the encoded data word is substantially balanced.

133. A method, as in claim 129, further comprising setting a logic state of at least one particular data element of the encoded data word such that the number of data elements in each logic state in the encoded data word is predetermined.

134. A method, as in claim 133, wherein said at least one particular data element is set based at least in part on the information.

135. A method, as in claim 133, wherein the at least one particular element comprises a parity element.

136. A method, as in claim 135, wherein said parity element is set based at least in part on the information.

137. A method, as in claim 115, wherein said decoding decodes a fourth sub-word of the encoded sub-words to generate a third sub-word of the data sub-words using a weight of a fifth sub-word of the encoded sub-words; wherein the fifth sub-word is not the fourth sub-word.

138. A method, as in claim 115, wherein said decoding decodes a fourth sub-word of the encoded sub-words to generate a third sub-word of the data sub-words using at least one data element of a fifth sub-word of the encoded sub-words; wherein the fifth sub-word is not the fourth sub-word.

139. A method, as in claim 115, wherein said decoding decodes a fourth sub-word of the encoded sub-words to generate a third sub-word of the data sub-words using at least one data element of the encoded word; wherein the at least one data element is not in the fourth sub-word.

140. A method, as in claim 115, wherein said decoding further comprises inverting all data elements of a fourth sub-word of the encoded data sub-words to generate a third sub-word of the data sub-words in response to a determination based at least in part on information in the encoded data sub-words other than the fourth sub-word.

141. A method, as in claim 115, wherein said decoding further comprises inverting all data elements of a code word decoded from a fourth sub-word of the encoded data sub-words to generate a third sub-word of the data sub-words in response to a determination based at least in part on information in the encoded data sub-words other than the fourth sub-word.

142. A method, as in claim 115, wherein said decoding decodes each encoded data sub-word by associating the encoded data sub-word with a data sub-word in a user defined way.

143. A method, as in claim 115, wherein said decoding binomially decodes each of the encoded sub-words.

* * * * *